(12) United States Patent
Kaneko et al.

(10) Patent No.: US 7,795,682 B2
(45) Date of Patent: Sep. 14, 2010

(54) SEMICONDUCTOR DEVICE AND METHOD MANUFACTURING SEMICONDUCTOR DEVICE

(75) Inventors: Akio Kaneko, Kawasaki (JP); Atsushi Yagishita, Yokohama (JP); Satoshi Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 702 days.

(21) Appl. No.: 11/700,147

(22) Filed: Jan. 31, 2007

(65) Prior Publication Data
US 2007/0190708 A1 Aug. 16, 2007

(30) Foreign Application Priority Data
Jan. 31, 2006 (JP) .............................. 2006-022310

(51) Int. Cl.
*H01L 29/786* (2006.01)
(52) U.S. Cl. ............... 257/351; 257/353; 257/E21.415; 257/E29.275; 257/E29.295; 438/154; 438/157; 438/164; 438/198
(58) Field of Classification Search ............... 257/351, 257/353, E29.275, E29.295; 438/154, 156, 438/157, 164, 198
See application file for complete search history.

(56) References Cited

U.S. PATENT DOCUMENTS 7,015,082 B2* 3/2006 Doris et al. .................. 438/153

2006/0057787 A1* 3/2006 Doris et al. .................. 438/153
2006/0284255 A1* 12/2006 Shin et al. .................... 257/351
2009/0101982 A1* 4/2009 Nagatomo .................... 257/368

OTHER PUBLICATIONS

Thompson et al., "In Search of "Forever," Continued Transistor Scaling One New Material at a Time", IEEE Transactions on Semiconductor Manufacturing, vol. 18, No. 1, pp. 26-36, (2005).
Thompson et al., "A 90-nm Logic Technology Featuring Strained-Silicon", IEEE Transactions on Electron Devices, vol. 51, No. 11, pp. 1790-1797, (2004).

* cited by examiner

*Primary Examiner*—Mary Wilczewski
*Assistant Examiner*—Toniae M Thomas
(74) *Attorney, Agent, or Firm*—Finnegan, Henderson, Farabow, Garrett & Dunner, L.L.P.

(57) ABSTRACT

The disclosure concerns a method of manufacturing a semiconductor device including forming a plurality of fins made of a semiconductor material on an insulating layer; forming a gate insulating film on side surfaces of the plurality of fins; and forming a gate electrode on the gate insulating film in such a manner that a compressive stress is applied to a side surface of a first fin which is used in an NMOSFET among the plurality of fins in a direction perpendicular to the side surface and a tensile stress is applied to a side surface of a second fin which is used in a PMOSFET among the plurality of fins in a direction perpendicular to the side surface.

12 Claims, 31 Drawing Sheets

N-type MIS

SEMICONDUCTOR DEVICE AND METHOD MANUFACTURING SEMICONDUCTOR DEVICE

CROSS REFERENCE TO RELATED APPLICATIONS

This application is based upon and claims the benefit of priority from the prior Japanese Patent Application No. 2006-022310, filed on Jan. 31, 2006, the entire contents of which are incorporated herein by reference.

BACKGROUND OF THE INVENTION

1. Field of the Invention

The present invention relates to a semiconductor device and a method of manufacturing a semiconductor device.

2. Related Art

In planar MOSFETS, stress induced carrier mobility enhancement techniques have been developed. On the other hand, FinFET (one of the double gate transistors) has been developed for CMOS scaling, low power operation and high performance.

However, non-planar device, such as FinFET or multiple-gate device, has different structure of the gate electrode and the channel region and channel orientation from those of planar MOSFET. Therefore, the method of applying stress effectively for carrier mobility enhancement is different from that of planar MOSFET. Furthermore, stress sensitivities of channel orientation for nMOSFET and pMOSFET are different from each other.

In planar CMOSFETs, technique of applying different direction of stress in fins of nMOSFET and pMOSFET from each other has been demonstrated to enhance carrier mobility of both nMOSFET and pMOSFET. For example, tensile SiN liner for nMOSFET and compressive SiN liner for pMOSFET have been used. This case, however, had the problem that the manufacturing process becomes complex, and the problem that the tensile and compressive stress can be canceled out in adjacent nMOSFET and pMOSFET. (see Scott E. Thompson et al. "In Search of "Forever", Continued Transistor Scaling One New Material at a Time" IEEE TRANSACTIONS ON SEMICONDUCTOR MANUFACTURING, VOL. 18, NO. 1, February 2005).

SUMMARY OF THE INVENTION

A method of manufacturing a semiconductor device according to an embodiment of the present invention comprises forming a plurality of fins made of a semiconductor material on an insulating layer; forming a gate insulating film on side surfaces of the plurality of fins; and forming a gate electrode on the gate insulating film in such a manner that a compressive stress is applied to a side surface of a first fin which is used in an nMOSFET among the plurality of fins in a direction perpendicular to the side surface and a tensile stress is applied to a side surface of a second fin which is used in a pMOSFET among the plurality of fins in a direction perpendicular to the side surface.

A method of manufacturing a semiconductor device according to an embodiment of the present invention comprises forming a plurality of fins made of a semiconductor material on an insulating layer; forming a gate insulating film on side surfaces of the plurality of fins; forming a gate electrode on the gate insulating film; and forming a stress film in such a manner that a tensile stress is applied to a side surface of a first fin which is used in an nMOSFET among the plurality of fins in a current flow direction of the nMOSFET and a compressive stress is applied to a side surface of a second fin which is used in a pMOSFET among the plurality of fins in a current flow direction of the pMOSFET, the stress film being formed on side surfaces of the first fin, on side surfaces of the second fin and on side surfaces of the gate electrode.

A semiconductor device according to an embodiment of the present invention comprises an insulating layer; a plurality of fins made of a semiconductor material on the insulating layer; a gate insulating film provided on side surfaces of the plurality of fins; and a gate electrode on the gate insulating film, the gate electrode applying a compressive stress to a side surface of a first fin which is used in an nMOSFET among the plurality of fins in a direction perpendicular to the side surface and applying a tensile stress to a side surface of a second fin which is used in a pMOSFET among the plurality of fins in a direction perpendicular to the side surface.

A semiconductor device according to an embodiment of the present invention comprises an insulating layer; a plurality of fins made of a semiconductor material on the insulating layer; a gate insulating film provided on side surfaces of the plurality of fins; a gate electrode on the gate insulating film; and a stress film applying a tensile stress to a side surface of a first fin which is used in an nMOSFET among the plurality of fins in a current flow direction (direction parallel to current flow) of the nMOSFET and applying a compressive stress to a side surface of a second fin which is used in a PMOSFET among the plurality of fins in a current flow direction of the pMOSFET, the stress film on side surfaces of a source and a drain regions of the fins.

A semiconductor device according to an embodiment of the present invention comprises a plurality of fins made of a semiconductor material; a gate insulating film formed on a side surface of each of the plurality of fins; a gate electrode formed on the gate insulating film; and a stress material buried between the fins and giving the same stress to the fins in the nMOSFET region and the pMOSFET region, whereby the mobility of both of the nMOSFET and the pMOSFET is enhanced by the stress from the stress material.

DETAILED DESCRIPTION OF THE INVENTION

Figure 1:
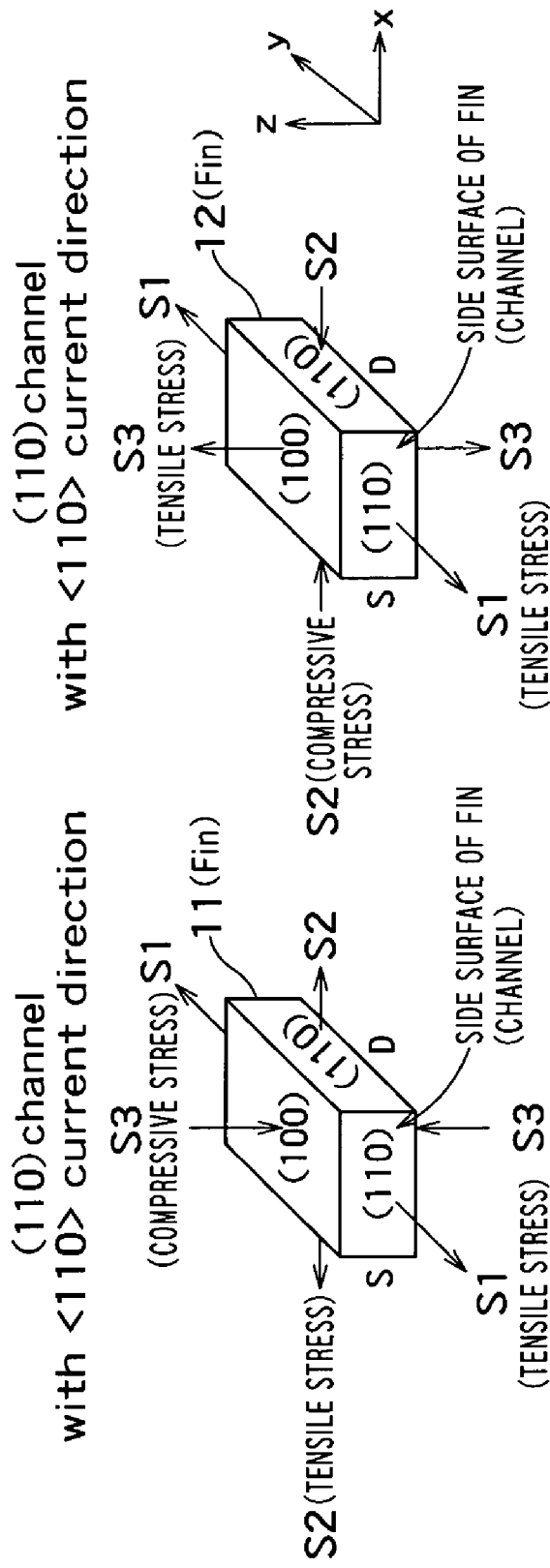
FIGS. 1A and 1B and FIGS. 2A and 2B are schematic diagrams of fins 11, 12 in a FinFET and stresses given to the fins 11, 12.

Embodiments related to the present invention will be described below with reference to the accompanying drawings. These embodiments do not limit the present invention. In the embodiments which will be given below, materials which give stresses to the surrounding by its contraction is called "contractive materials" and materials which give stresses to the surrounding by its expansion is called "expansive materials". "Contractive material" is, usually, called "compressive stressor" and "expansive material" is, usually, called "tensile stressor" However, compressive stress liner sometime gives tensile stress as mentioned below. For example, when the contractive material is filled between elements, the elements receive tensile stress toward the contractive material by its contraction. In order to avoid confusions, the words "contractive material" and "expansive material" are used herein after.

FIGS. 1A and 1B and FIGS. 2A and 2B shows schematic diagrams of fins 11, 12 of a FinFET and stresses direction of the fins 11, 12. The fin 11 is a first fin included in an nMOSFET and the fin 12 is a second fin included in a pMOSFET. The first and second fins 11 and 12 are formed from a single crystal silicon, for example.

A gate insulating film and a gate electrode (not shown in FIG. 1A to FIG. 2B) are formed on a crystal plane to which a stress S1 is applied. The stress S1 is applied in a direction perpendicular to side surfaces of the fin 11, 12. A stress S2 is applied in a current flow direction (in the source-drain direction). A stress S3 is applied in a channel width direction (vertical direction, or direction perpendicular to the current flow direction and parallel to fin side surface).

Hereinafter, a plane to which the stress S1 is applied is regarded as the side surface, the plane to which the stress S2 is applied is regarded as the front surface, and a (100) plane to which the stress S3 is applied is regarded as the top surface. A region between a source (S) and a drain (D) through which a current flows is called the channel region.

The arrows in FIG. 1A and FIG. 2B indicate the application directions of stresses which are effective in improving carrier mobility. Effects of stresses on carrier mobility are indicated in three stages (very effective, effective, somewhat effective).

Each of the fins of FIGS. 1A and 1B is formed in a semiconductor substrate having a notch (an orientation flat) perpendicular to the (110) plane, which is hereinafter referred to as a <110> notch wafer.

In the nMOSFET of FIG. 1A, carrier mobility is enhanced when a tensile stress is applied to the side surface of the first fin 11 in a direction perpendicular to the side surface as by the stress S1. Carrier mobility is enhanced when a tensile stress is applied to the first fin 11 in the current flow direction as by the stress S2. Furthermore, carrier mobility is enhanced when a compressive stress is applied to the first fin 11 in the channel width direction by the stress S3. In terms of the effect on carrier mobility enhancement, the stress S3 is classified as "very effective", and the degree of this effect weakens in order, S3, S2 and S1.

In contrast to this, in the pMOSFET of FIG. 1B, carrier mobility is enhanced when a tensile stress is applied to the side surface of the second fin 12 in a direction perpendicular to the side surface as by the stress S1. Carrier mobility is enhanced when a compressive stress is applied to the second fin 12 in the current flow direction by the stress S2. Furthermore, carrier mobility is enhanced when a tensile stress is applied to the second fin 12 in the channel width direction by the stress S3. In terms of the effect on carrier mobility enhancement, the stress S2 is classified as "very effective", and the degree of this effect weakens in order, S2, S1 and S3. Thus, the application directions of stresses for enhancing carrier mobility are different between the nMOSFET and the PMOSFET.

Each of the fins of FIGS. 2A and 2B is formed in a semiconductor substrate having a notch (an orientation flat) perpendicular to the (100) plane, which is hereinafter referred to as a <100> notch wafer.

Figure 2:
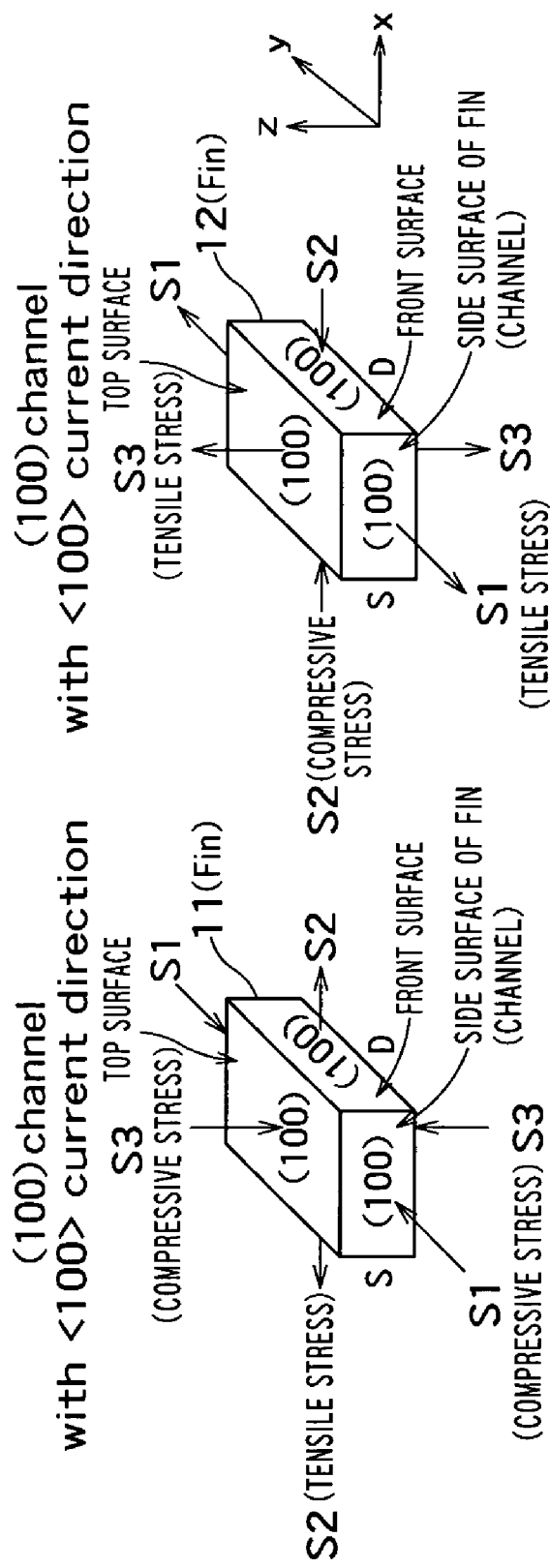

Each of the fins of FIGS. 2A and 2B corresponds to a fin which is obtained by rotating the fins of FIGS. 1A and 1B through 45 degrees, with the application direction of the stress S3 serving as an axis. The top surface, side surfaces and front surface of the fins 11 and 12 is the (100) plane.

In the nMOSFET of FIG. 2A, carrier mobility is enhanced when a compressive stress is applied to the side surface of the first fin 11 in a direction perpendicular to the side surface by the stress S1. Carrier mobility is enhanced when a tensile stress is applied to the first fin 11 in the current flow direction by the stress S2. Furthermore, carrier mobility is enhanced when a compressive stress is applied to the first fin 11 in the channel width direction as by the stress S3. In terms of the effect on carrier mobility enhancement, the stress S2 is classified as "very effective", and the stresses S1 and S3 are classified as "effective".

In contrast to this, in the pMOSFET of FIG. 2B, carrier mobility is enhanced when a tensile stress is applied to the side surface of the second fin 12 in a direction perpendicular to the side surface as by the stress S1. Carrier mobility is enhanced when a compressive stress is applied to the second fin 12 in the current flow direction as by the stress S2. Furthermore, carrier mobility enhances when a tensile stress is applied to the second fin 12 in the channel width direction by the stress S3. In terms of the effect on carrier mobility enhancement, the stress S2 is classified as "effective", and the stresses S1 and S3 are classified as "somewhat effective". Even in the case of a 45-degree notch wafer, the application direction of stresses for enhancing carrier mobility is different between the nMOSFET and the pMOSFET.

Figure 3:
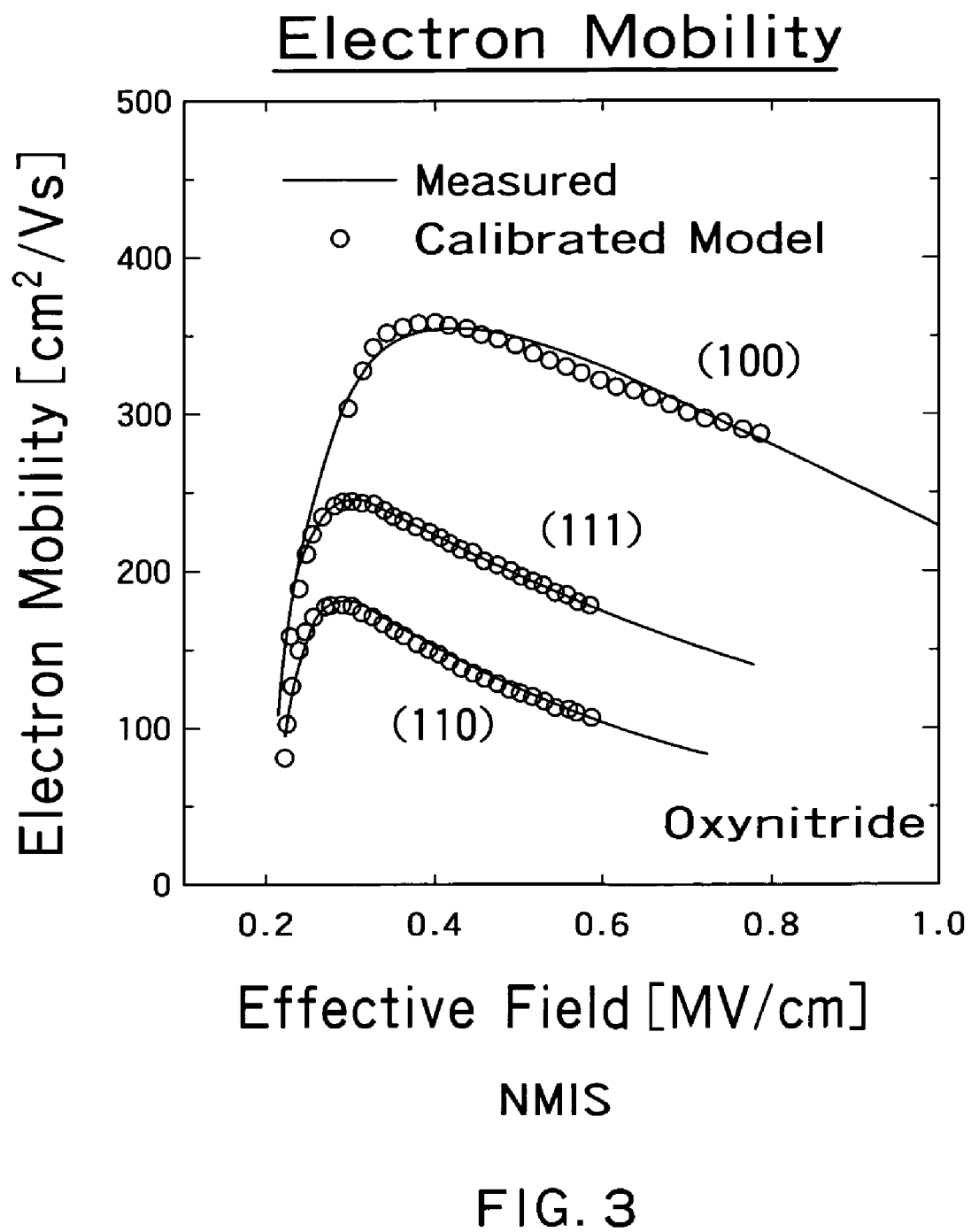
FIGS. 3 and 4 are graphs showing the relationship between the channel orientation of a fin and carrier mobility.
Figure 4:
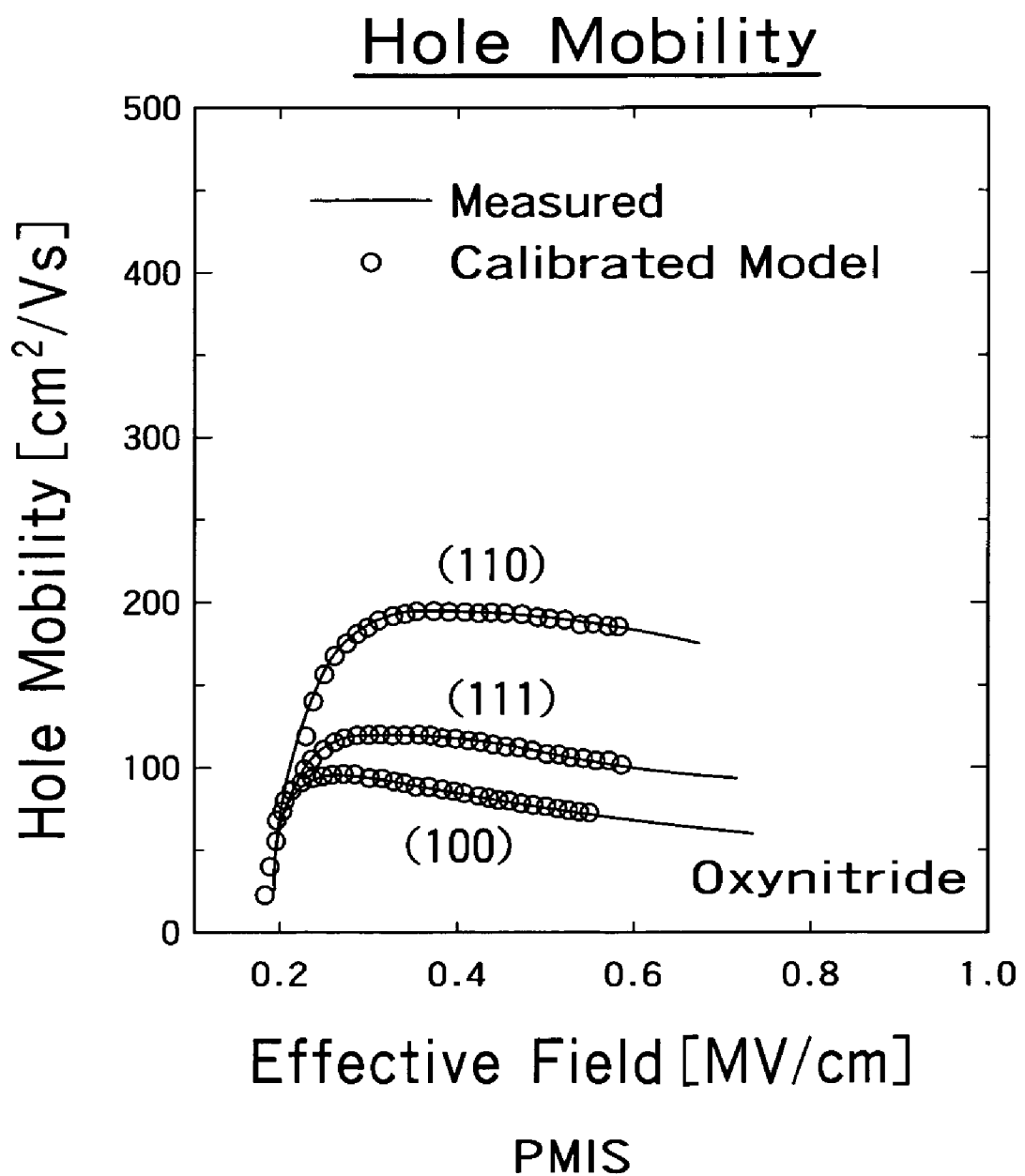

FIGS. 3 and 4 are graphs which show the relationship between the channel orientation of a fin and carrier mobility. As shown in FIG. 3, in the n-FinFET, high carrier mobility is obtained when a gate insulating film and a gate electrode are formed on fin side surface with (100) orientation. As shown in FIG. 4, p-FinFET, high carrier mobility is obtained when a gate insulating film and a gate electrode are formed on fin side surface with (110) orientation.

On the basis of the above-described relationship between stress and carrier mobility, embodiments of the present invention will be described below. In a semiconductor device and a method of manufacturing a semiconductor device in the embodiments of the present invention, an insulating film and multiple fins which are formed on the surface of the insulating film and made of a semiconductor material are readily obtained by using an SOI (silicon on insulator) wafer. However, as it is necessary only that devices adjacent to each other are electrically insulated during the operation of the devices, it is also possible to use a bulk substrate. In this case, as an embodiment corresponding to FIG. 11, an embodiment shown in FIG. 36 can be used, in which a substrate 5 and fins are connected.

First Embodiment

Figure 5:
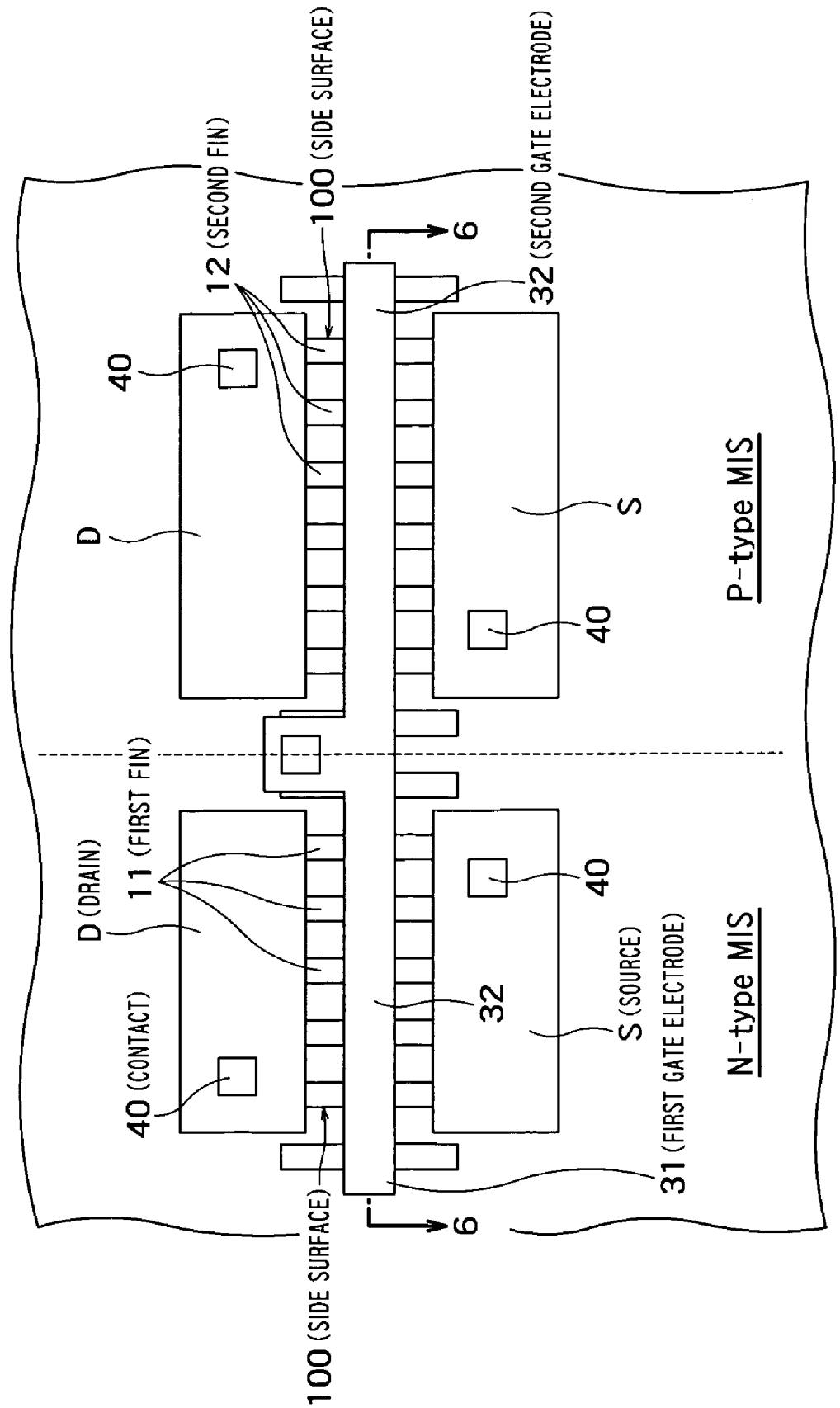
FIG. 5 is schematics of plan view of a FinFET in the first embodiment of the present invention.
Figure 6:
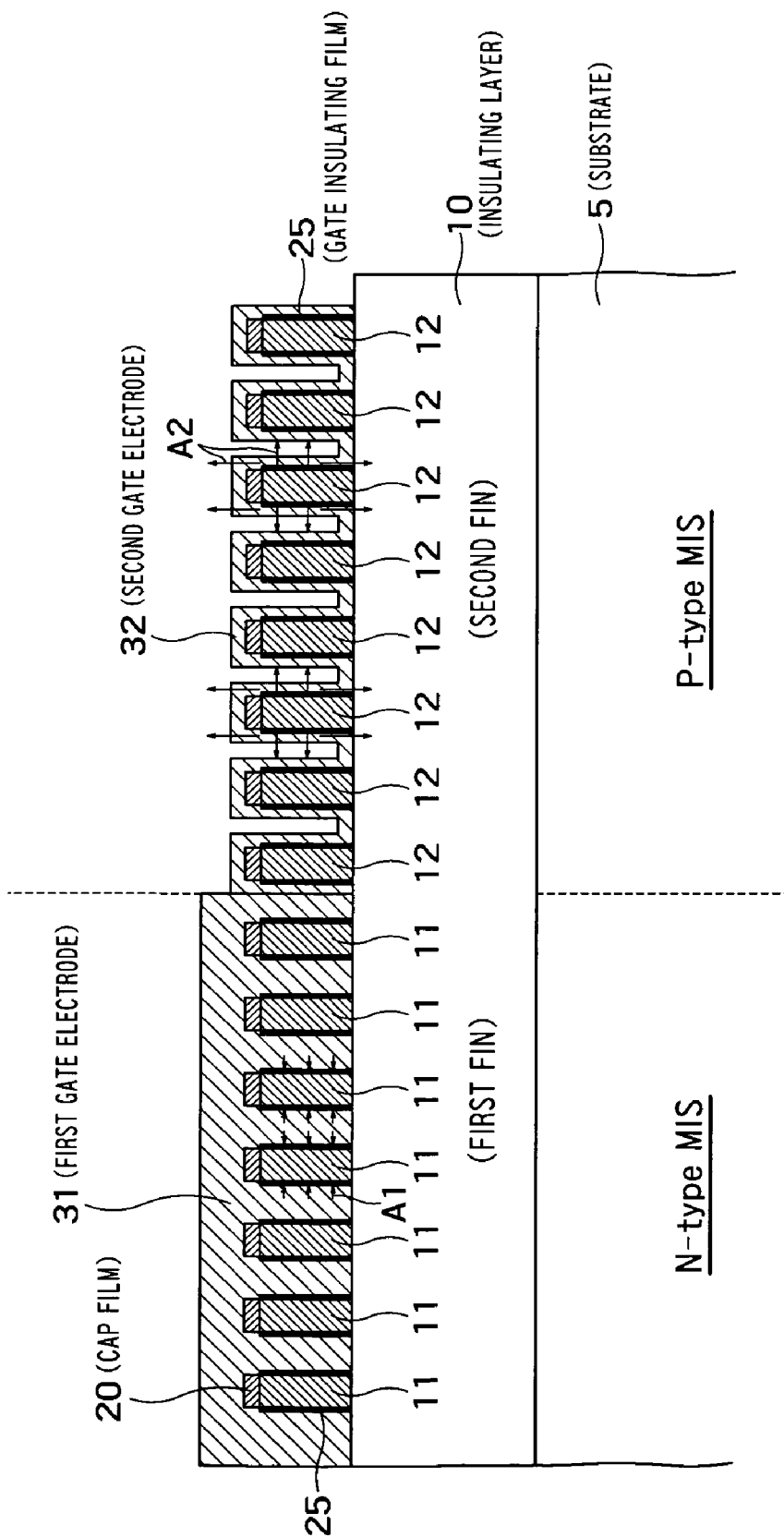
FIG. 6 is a cross-sectional view taken along the line 6-6 of FIG. 5.

FIG. 5 is a plan view of a FinFET in the first embodiment of the present invention. FIG. 6 is a cross-sectional view taken along the line 6-6 of FIG. 5. This embodiment will be explained with FIGS. 5 and 6. In the first embodiment, a <100> notch wafer is used. Each side surface of the first fin 11 and the second fin 12 is a (100) orientation of a single crystal silicon. In the figures, for the sake of convenience, the nMOSFET and the pMOSFET are shown in a parallel arrangement. The first embodiment can be used as a CMOS inverter, for example.

As shown in FIG. 6, the FinFET comprises a substrate 5, an insulating layer 10, first fins 11, second fins 12, cap films 20, gate insulating films 25, first gate electrodes 31, and second gate electrodes 32. The substrate 5 is, for example, a silicon substrate. The insulating film 10 is, for example, a silicon oxide film and provided on the substrate 5. The first and second fins 11, 12 are made of, for example, a single crystal silicon and provided on the insulating film 10.

In this embodiment, an SOI (silicon on insulator) substrate may also be used. In this case, it is possible to use a BOX (buried oxide) layer of the SOI substrate as the insulating later 10 and to form the first and second fins 11, 12 by processing the SOI layer.

The cap film 20 is made of, for example, a silicon nitride film and provided on top surfaces of the first and second fins 11, 12. The cap film 20 is used as a hard mask when the first and second fins 11, 12 are formed. The cap film 20 is also used as a protective film which protects the top surfaces of the first and second fins 11, 12.

The gate insulating film 25 is formed on side surfaces (the crystal plane with a (100) orientation) of the first and second fins 11, 12. The gate insulating film 25 is, for example, a silicon oxide film, a silicon oxynitride film and/or HfSiON.

The first gate electrode 31 is formed on the gate insulating film 25. Furthermore, the first gate electrode 31 is formed so as to be filled between first electrodes 11 which are adjacent to each other in a section perpendicular to the side surface of the first fin 11 (the crystal plane with a (100) orientation).

The second gate electrode 32 is also formed on the gate insulating film 25. However, the second gate electrode 32 is not filled between second fins 12 which are adjacent to each other in a section perpendicular to the side surface of the second fins 12 (the plane with a (100) orientation) and is formed to provide a gap. In other words, the film thickness of the second gate electrode 32 is less than ½ of the spacing between second fins 12 which are adjacent to each other. The first gate electrode 31 and the second gate electrode 32 are made of the same material which is, for example, metal silicides, such as nickel silicide, hafnium silicide, platinum silicide and erbium silicide. Incidentally, in order to obtain thermal stability in the manufacturing process, this metal suicide may contain oxygen, carbon, nitrogen and the like. To improve the reliability of the gate insulating film, this metal silicide may contain fluorine, chlorine, hydrogen and the like. To control the threshold voltage of a transistor, this metal silicide may contain germanium, boron, aluminum, gallium, indium, phosphorus, arsenic, antimony or the like. Furthermore, to apply stresses much more, this metal silicide may contain zirconium or tungsten.

As shown in FIG. 5, the first and second gate electrodes 31, 32 are formed in such a manner as to cover the channel regions of the first and second fins 11, 12, respectively. Regions of the first and second fins 11, 12, which are covered with the gate electrodes 31, 32, except for the channel regions are a source region and a drain region. The source layer and the drain layer are electrically connected to upper layer interconnections via contacts 40.

Metal suicides themselves, such as nickel silicide, are expansive materials. Therefore, the first gate electrode 31 of the nMOSFET expands between the first fins 11 which are adjacent to each other. As a result of this, the first gate electrode 31 compresses the side surfaces of the first fin 11 from a direction perpendicular to the side surfaces as indicated by the arrows A1 of FIG. 6. That is, the compressive stress S1 is applied. The first gate electrode 31 compresses the side surfaces of the first fin 11 in such a manner as to surround the fin 11 and, therefore, the first gate electrode 31 generates also the compressive stress S3, with the result that the first gate electrode 31 generates also the tensile stress S2. As shown in FIG. 2A, these stresses S1 to S3 improve the carrier mobility of the nMOSFET.

In the case of the PMOSFET, although the second gate electrode 32 covers the side surfaces and top surface of the second fin 12, it covers these surfaces in a thin film condition. Therefore, the gate electrode 32 is not filled between the second fins 12 which are adjacent to each other and a gap is present. As a result of this, stresses acting on each other between the second fins 12 which are adjacent to each other are small. That is, the stress S3 in the pMOSFET is weaker than the stress S3 in the nMOSFET. Again, the gate electrode 32 is an expansive material (tensile stressor). Therefore, the second gate electrode 32 tenses the side surfaces of the second fin 12 in a direction perpendicular to the side surfaces (in the direction of the stress S1) as indicated by the arrows A2 of FIG. 6. When the gate electrode 32 is sufficiently thin, the effect of the stress S3 is small. As a result of this, the second fin 12 is compressed in the direction of the stress S2. For this reason, the mobility of the pMOSFET is also improved.

As described above, in this embodiment, the first gate electrode 31 and the second electrode 32, which are made of the same material, compress the side surfaces of the first fin 11 and tense the side surfaces of the second fin 12, respectively. As will be seen from FIGS. 2A and 2A, these stresses can improve the carrier mobility of both of the nMOSFET and the pMOSFET.

The FinFET is advantageous in the following points. The FinFET has a double gate structure in which the gate electrode is provided on the two side surfaces of the fin. As a result of this, the FinFET suppresses the short channel effect and enables a leakage current due to a punch-through between the source and the drain to be reduced. Also, because transverse electric field (perpendicular to the channel region) is smaller than that of planar, it is possible to improve mobility. Furthermore, because an off-leakage current can be reduced, it is possible to heighten the fin or increase the number of fins accordingly. As a result of this, the drive currents of a CMOS can be improved.

Next, a method of manufacturing a FinFET of this embodiment will be described below.

FIGS. 7 to 13 are perspective views which show the flow of a method of manufacturing a FinFET in the first embodiment of this embodiment. For the simplicity, only two fins are shown in these figures. First, an SOI substrate with (100) surface orientation with <110> notch direction is prepared. The thickness of the SOI layer is, for example, 50 nm to 100 nm or so. By performing channel doping (for example, ion implantation with As, P, B, $BF_2$ and the like) in a channel region on the SOI layer, the channel impurity concentration of about $1\times10^{18}$ $cm^{-3}$ is obtained.

Figure 7:
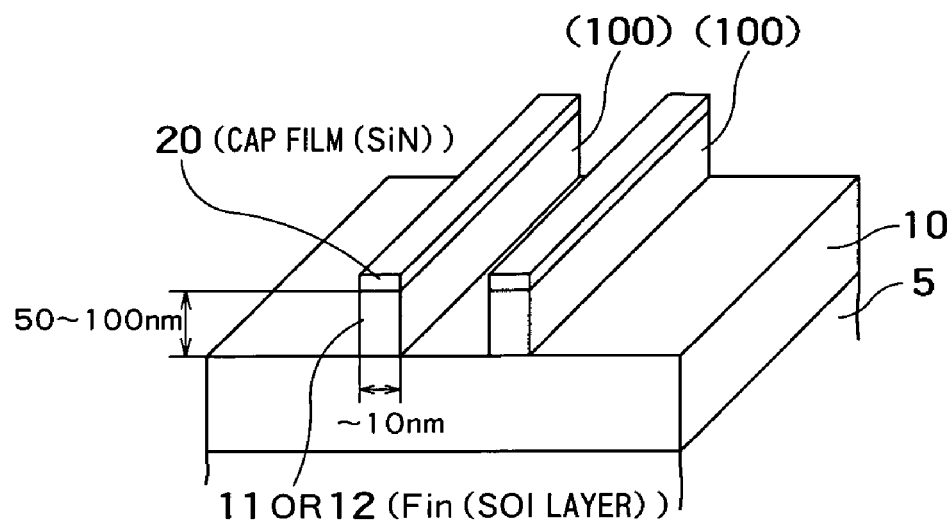
FIGS. 7 to 13 are bird's-eye views of a method of manufacturing a FinFET in the first embodiment.
Figure 8:
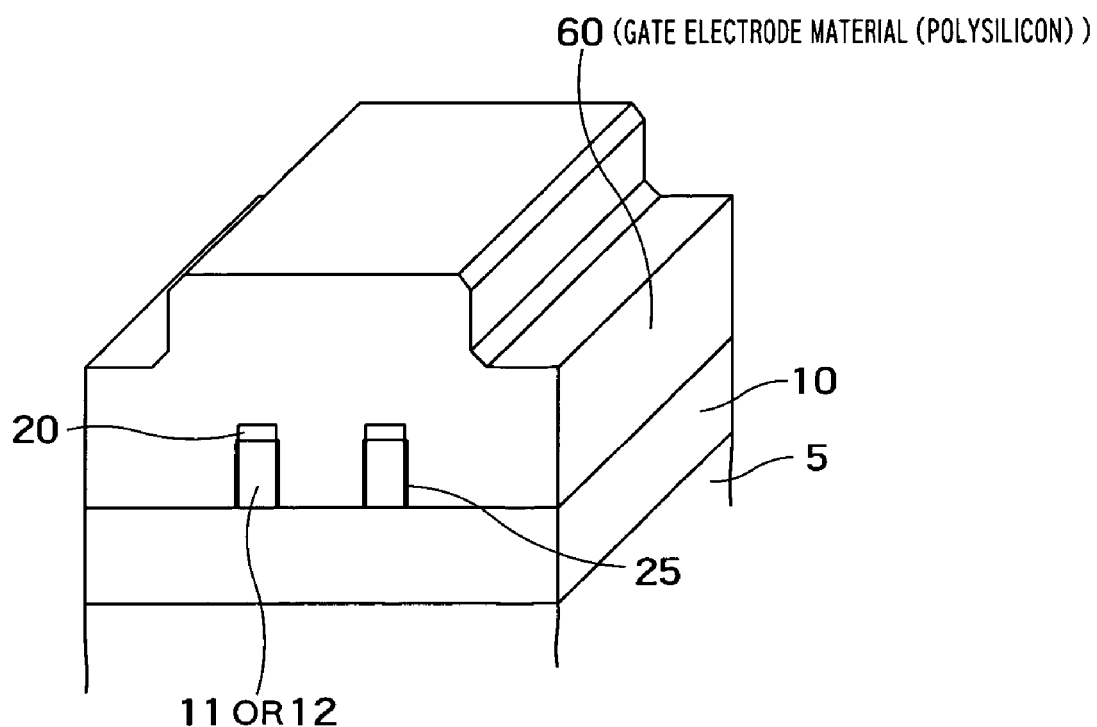

Next, a silicon nitride film is deposited on the SOI layer in a thickness of about 70 nm. The silicon nitride film can be formed, for example, by the thermal CVD process in an atmosphere containing dichlorosilane ($SiH_2Cl_2$) and ammonia ($NH_3$) at an atmospheric pressure of 1 torr and at 800° C. The SOI layer is etched by RIE by use of the silicon nitride film as a hard mask after patterning the silicon nitride film. As a result of this, as shown in FIG. 7, first and second fins 11 and 12 are formed on the insulating film (BOX layer) 10. The first and second fins 11 and 12 each have a crystal plane with a (100) orientation as their side surface and this side surface becomes a channel surface. The top surface of each of the first and second fins 11 and 12 is coated with a cap film 20 made of a silicon nitride film.

Next, a gate insulating film 25 is formed on side surfaces of the first and second fins 11 and 12. The gate insulating film 25 is, for example, a silicon oxide film having a film thickness of, for example, about 2 nm. This silicon oxide film is formed by, for example, oxidation in a mixed atmosphere of $O_2$ and $H_2$ at an atmospheric pressure of 10 torrs at 1,000° C. and for 15 minutes. Thus, the gate insulating film 25 may be a silicon oxide film which is formed by the thermal oxidation of the first and second fins 11 and 12. Alternatively, the gate insulating film 25 may also be a high-dielectric-constant film, such as hafnium silicate and the like deposited on the side surfaces of the first and second fins 11 and 12. Subsequently, a polysilicon film 60 is deposited in a thickness of about 300 nm as a gate electrode material. The polysilicon film 60 is deposited, for example, in a mixed atmosphere of $SiH_4$, $N_2$ and $H_2$ at an atmospheric pressure of 1 torr and at 620° C.

Figure 9:
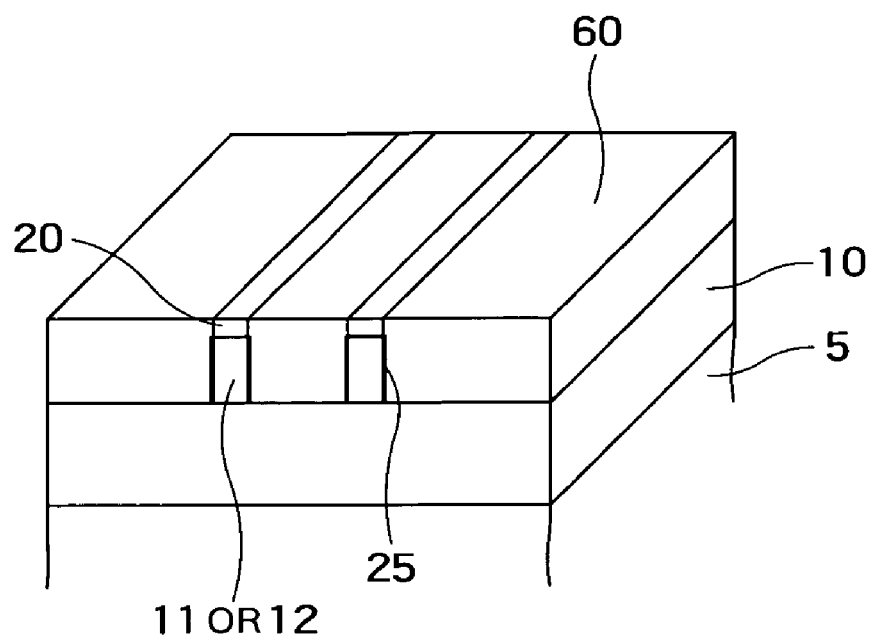
Figure 10:
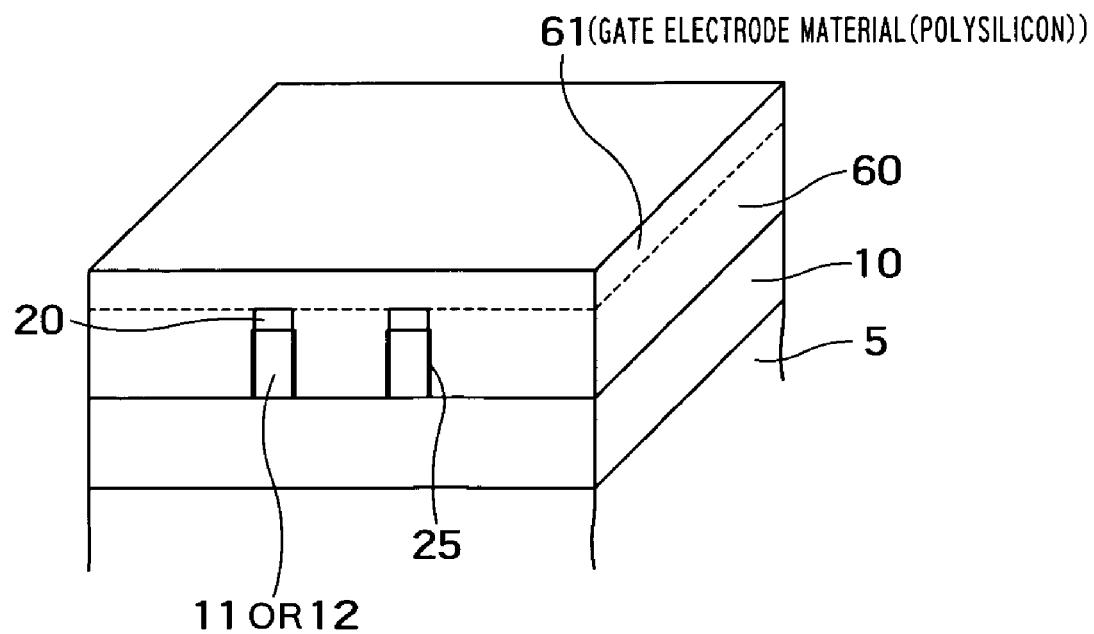

Next, the polysilicon film 60 is planarized by CMP (chemical mechanical polishing) and, as shown in FIG. 9, the polysilicon film 60 is etched back until the cap film 20 is exposed. Next, as shown in FIG. 10, a polysilicon film 61 as a gate electrode material is deposited again. At this time, the film thickness of the polysilicon film 61 is, for example, about 50 nm. A gate electrode 62 consist of the polysilicon film 60 and the polysilicon film 61.

When the polysilicon films 60 and 61 are exposed to the oxygen in the air, a silicon oxide film may sometimes be formed between the polysilicon films 60 and 61. There is a fear that this silicon oxide film may prevent the diffusion of a dopant for gate electrode which has been ion implanted from above the polysilicon films 61. Therefore, in the film deposition process of the polysilicon film 61, it is preferable that after annealing in an $H_2$ atmosphere at an atmospheric pressure of 10 torrs at 800° C. and for about 1 minute, the polysilicon film 61 is formed following the annealing without being exposed to the atmospheric air. In this annealing, treatment may be performed not only in an $H_2$ atmosphere, but also in an HCl atmosphere at an atmospheric pressure of 10 torrs at 750° C. and for about 1 minute. Alternatively, in this annealing, treatment may be performed in an $N_2$ atmosphere at an atmospheric pressure of 1 torr and at 900° C. for about 10 minutes. Furthermore, it is possible to use a mixed atmosphere of $H_2$ and HCl, a $BCl_3$ atmosphere, $NF_3$ atmosphere and the like.

Figure 11:
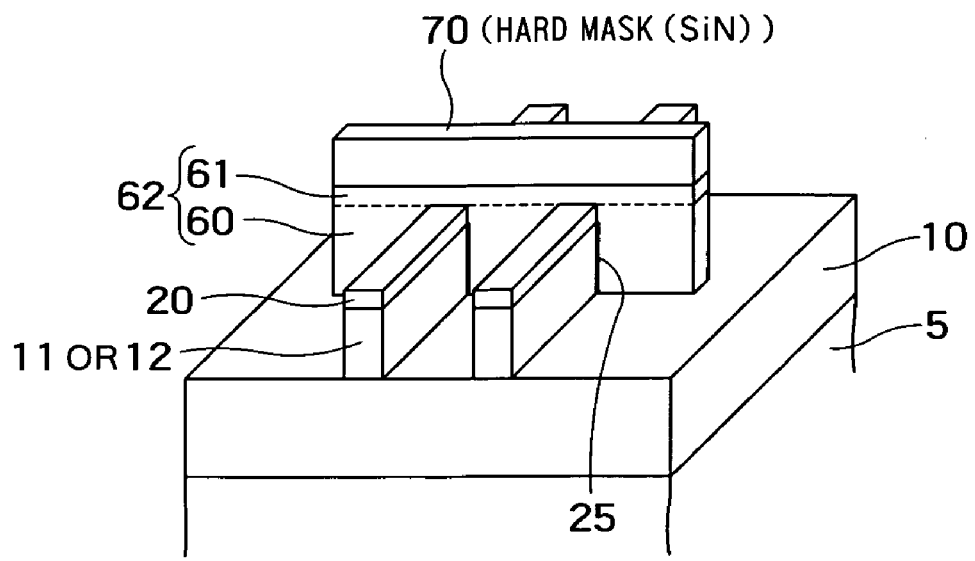

Next, a silicon nitride film 70 for hard mask is deposited on the polysilicon film 61 in a thickness of about 100 nm. As shown in FIG. 11, the silicon nitride film 70 is formed in a pattern of the gate electrode by using the lithography technology and RIE. Next, the polysilicon films 60 and 61 are etched by RIE by using the silicon nitride film 70 after patterning as a hard mask. As a result of this, as shown in FIG. 11, the gate electrode 62 made of polysilicon is formed so as to cover side surfaces (channel region) and top surface of the first and second fins 11 and 12. The silicon nitride film 70 is used as a protective film for the gate electrode material 62 in a later step. Therefore, the silicon nitride film 70 is called also the protective film 70.

Figure 12:
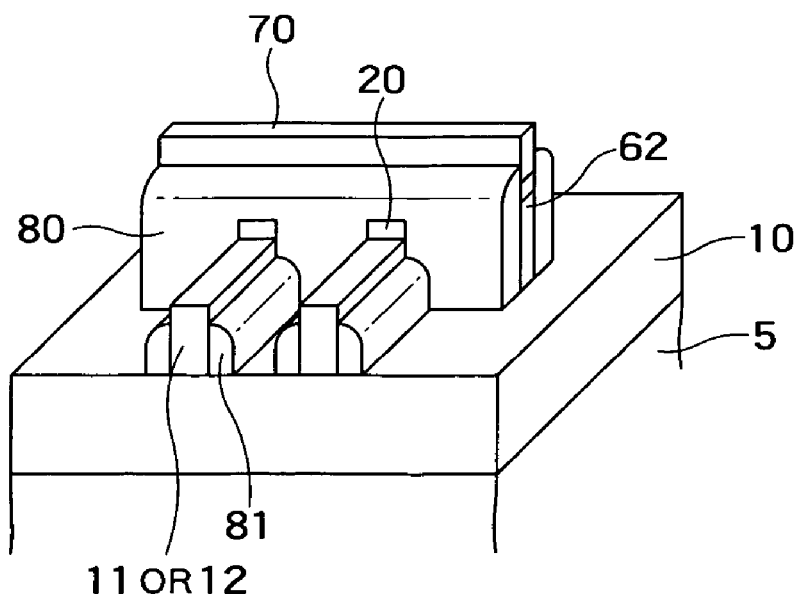

After that, a TEOS film (an $SiO_2$ layer formed by using TEOS ($Si(OC_2H_5)_4$)) as a material for a gate sidewall film is deposited. By etching back this TEOS film, a gate sidewall film 80 is formed as shown in FIG. 12. The film thickness of the gate sidewall film 80 is about 40 nm. At this time, a gate sidewall film 81 may be formed also on the side surfaces of the first and second fins 11 and 12. Next, by etching the silicon nitride film by RIE, the silicon nitride film 20 on the first and second fins 11 and 12 is removed. At this time, the protective film 70 on the gate electrode material 62 is also etched. However, because the protective film 70 is thicker than the silicon nitride film 20, the protective film 70 remains on the gate electrode material 62. The silicon nitride film 20 on the first and second fins 11 and 12 and the channel region remains because this silicon nitride film 20 is coated with the gate electrode material 62.

Next, the source-drain region of the fin 11 and 12 is silicided. As the material for the siliciding of the source-drain region, erbium (Er) can be used for the nMOSFET and platinum (Pt) can be used for the pMOSFET. As a result of this, the source-drain region of the nMOSFET becomes ErSi and the source-drain region of the pMOSFET becomes PtSi. At this time, the gate electrode material 62 is not silicided because the gate electrode material 62 is coated with the silicon nitride film 70 and the gate side wall film 80.

Before the silicidation of the source-drain region, impurities may be introduced in the source-drain region. However, when a source-drain region structure of a Schottky junction is formed, it is unnecessary to introduce impurities in the source-drain region.

Figure 13:
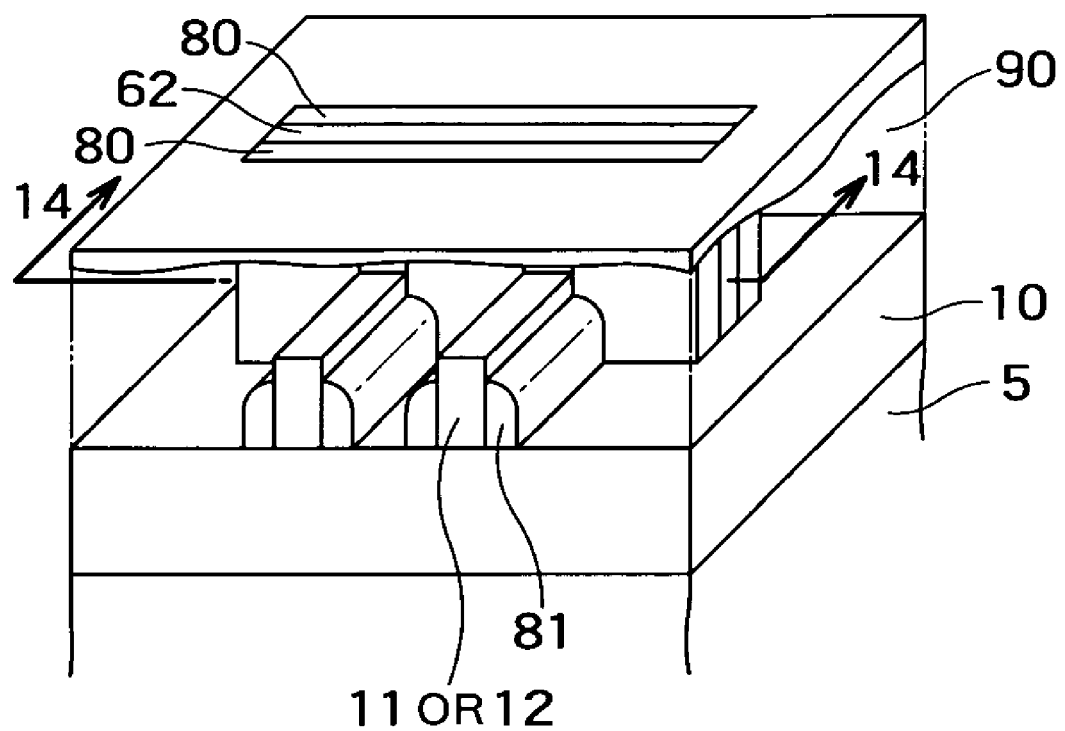

Next, for example, an interlayer dielectric film 90 made of a TEOS film is deposited in a thickness of about 400 nm. Subsequently, this interlayer dielectric film 90 is planarized by CMP, whereby the surface of the gate electrode material 62 is exposed. At this time, CMP may be stopped before the surface of the gate electrode material 62 is exposed. When the TEOS film remains on the protective film 70, etching is performed by RIE until the top surface of the protective film 70 is exposed. Next, the protective film 70 is removed by using a hot phosphoric acid solution. In this way, the top surface of the gate electrode material 62 is exposed. The structure obtained at this time is shown in FIG. 13.

The manufacturing steps after the step shown in FIG. 13 will be described by referring to FIGS. 14 to 17. FIGS. 14 to 17 correspond to cross-sectional views taken along the line 14-14 of FIG. 13. However, to help understanding, in FIGS. 14 to 17, the number of fins is made larger than the number fins shown in FIG. 13 and nMOSFETs and pMOSFETs are placed in a line.

Figure 14:
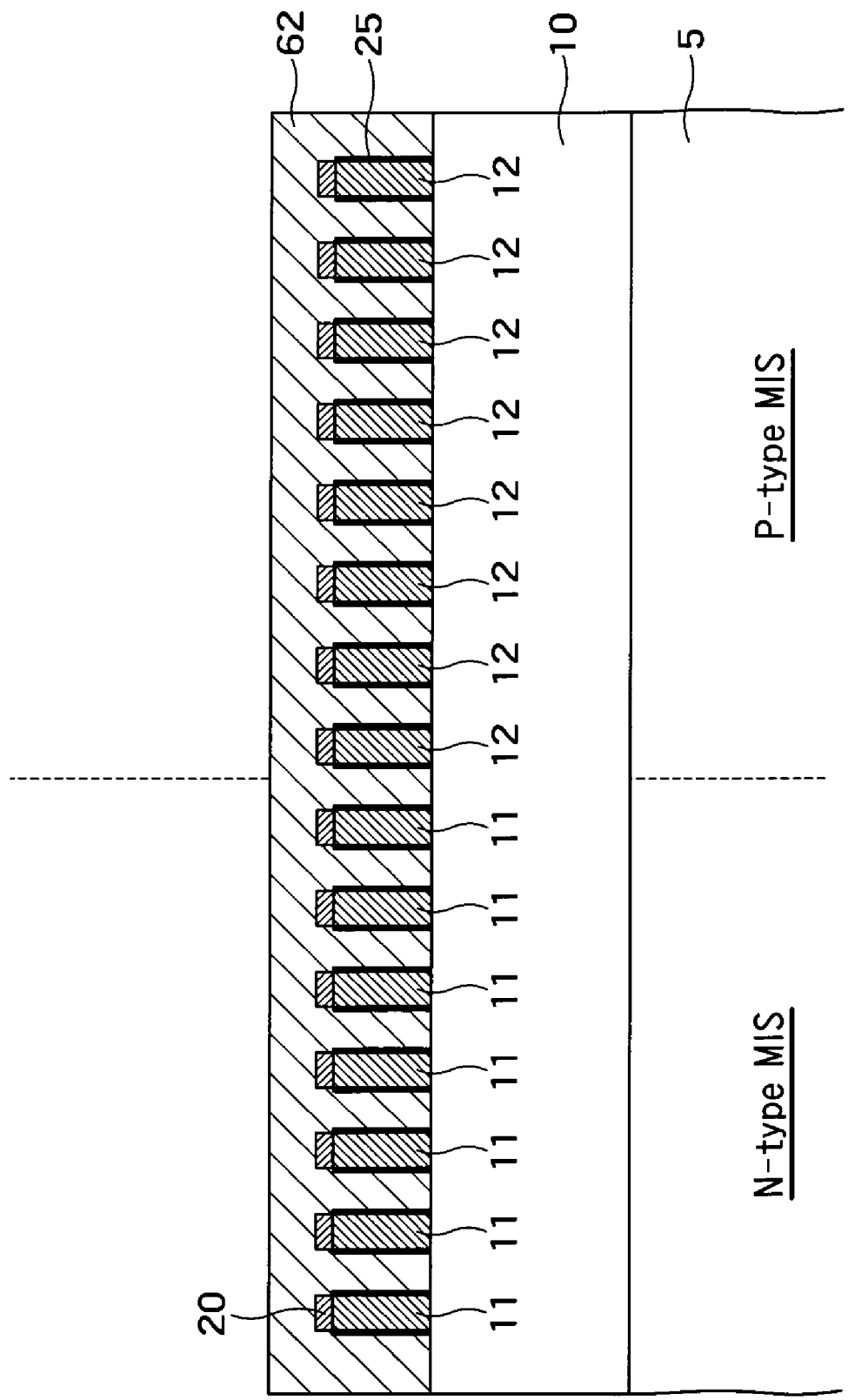
FIGS. 14 to 17 are cross-sectional views of a method of manufacturing a FinFET in the first embodiment, and following the step shown in FIG. 13.
Figure 15:
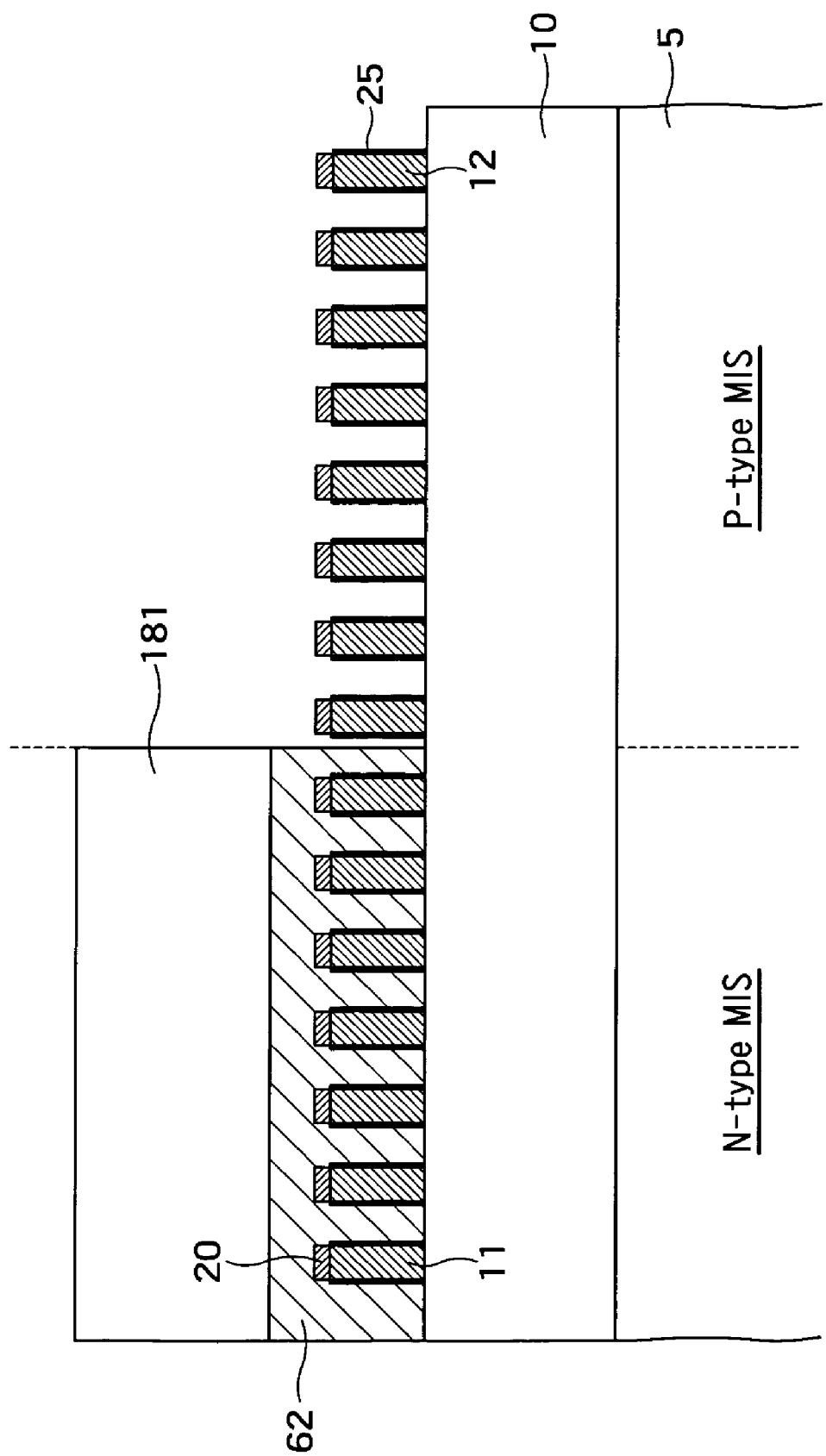

In FIG. 14, the top surface of the gate electrode material 62 is in an exposed condition. Next, a photoresist 181 is coated on the gate electrode material 62 and in the photolithography process, the photoresist 181 is patterned to remain on the nMOSFET region. Subsequently, as shown in FIG. 15, the gate electrode material 62 in the pMOSFET region is removed by RIE, CDE or wet etching by use of photoresist 181 as a mask.

Figure 16:
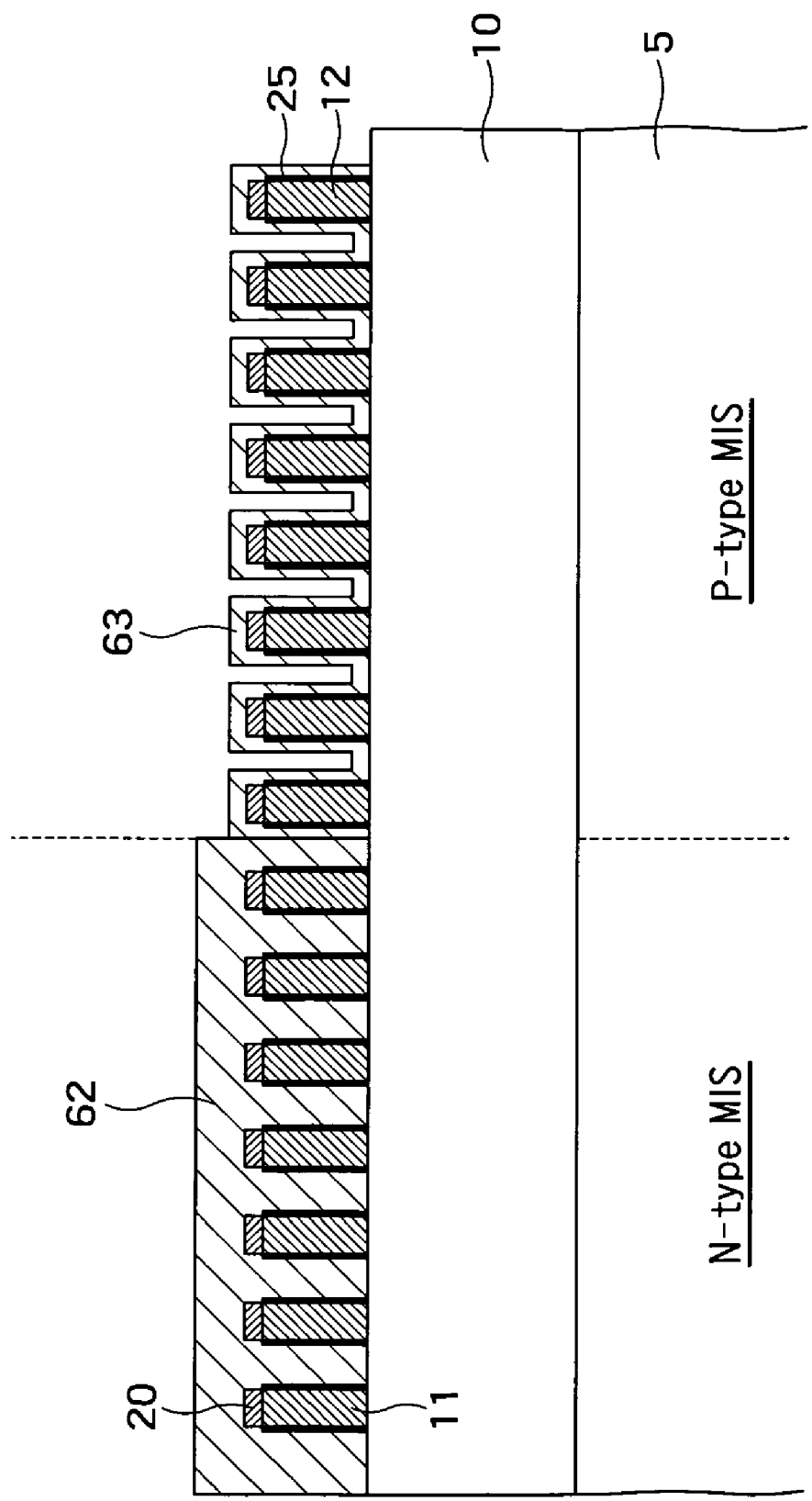

After the removal of the photoresist 181, as shown in FIG. 16, a gate insulating film and a gate electrode material 63 are formed. The gate electrode material 63 is deposited on side surfaces of the second fin 12 in a thickness of not more than ½ of the spacing between the second fins 12 which are adjacent to each other. An gate material residue on the TEOS is removed by CMP, lithography and RIE.

Figure 17:
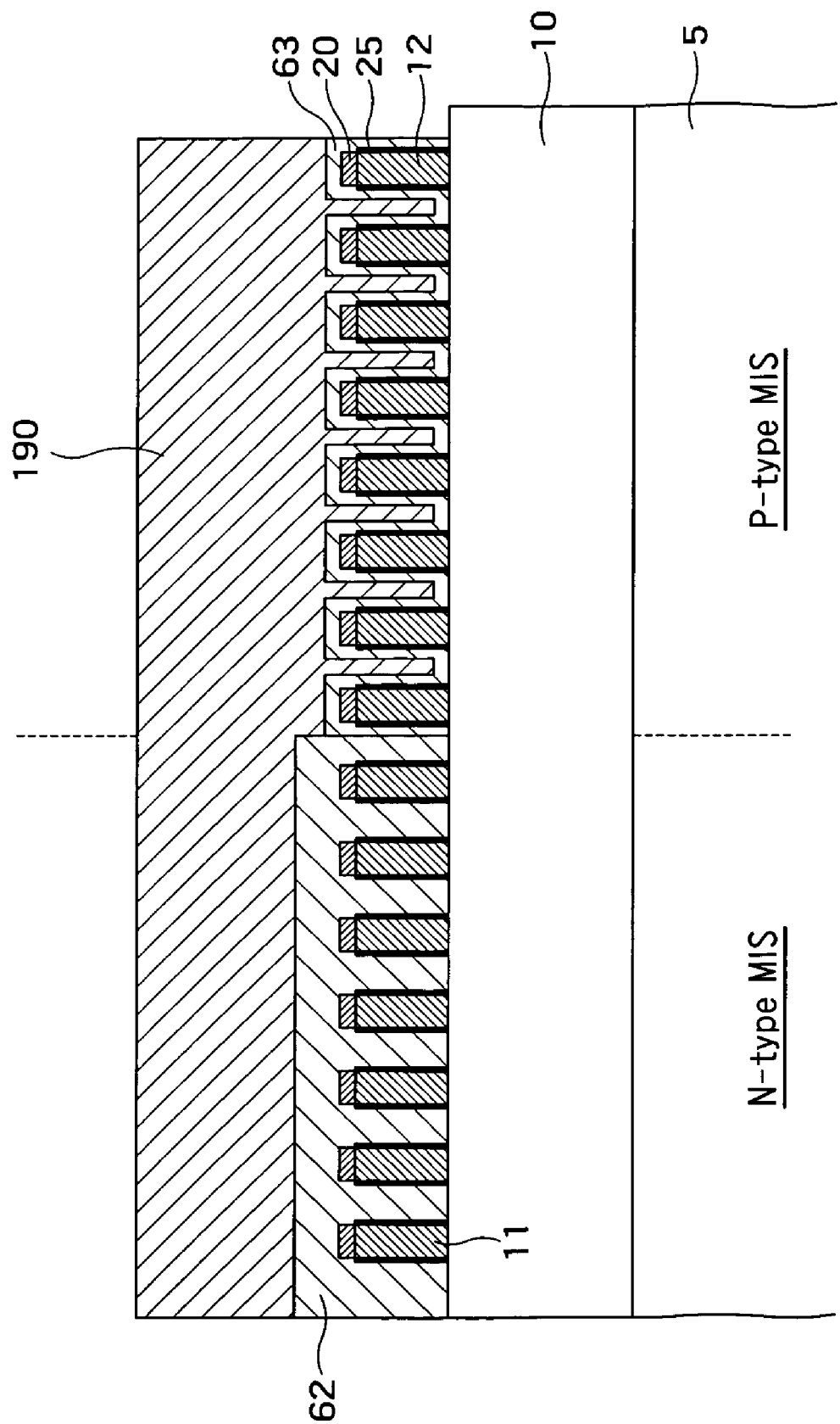

Next, as shown in FIG. 17, a metal film 190 is deposited on the gate electrode materials 62 and 63. The metal film 190 is, for example, nickel and cobalt. Furthermore, the metal film 190 and the gate electrode materials 62 and 63 react with each other by performing heat treatment. At this time, the substantial whole of the gate electrode materials 62 and 63 is silicided, whereby a first gate electrode 31 and a second gate electrode 32 are formed. The first gate electrode 31 and the second gate electrode 32 are, for example, nickel silicide. The structure shown in FIG. 6 is obtained in this manner.

Polysilicon expands when it is silicided. Therefore, as described above, the first gate electrode 31 gives a compressive stress to side surfaces of the first fin 11. The second gate electrode 32 gives a tensile stress to side surfaces of the second fin 12.

After that, an interlayer insulating film, contacts, interconnections and the like are formed by using known methods, whereby a FinFET is completed.

According to the manufacturing method of this embodiment, the silicidation step for the source-drain region and the silicidation step for the gate electrodes can be separately provided. For this reason, it is possible to suppress an excessive increase in the film thickness of the silicide in the source-drain region. This leads to a suppression of off-leakage.

Because fully-silicided gate electrode technology is used in the manufacturing method of the present invention, gate electrodes can be relatively easily formed compared to a case where metal electrodes such as TiN are used.

In this embodiment, it is also possible to use a <110> notch wafer. In this case, in order to use (100) side surface of the first and second fins 11 and 12 as channel surface, the layout design of the fins is twisted through 45 degrees with respect to an orientation flat in a plane parallel to the surface of the semiconductor substrate.

Modification of First Embodiment

Figure 18:
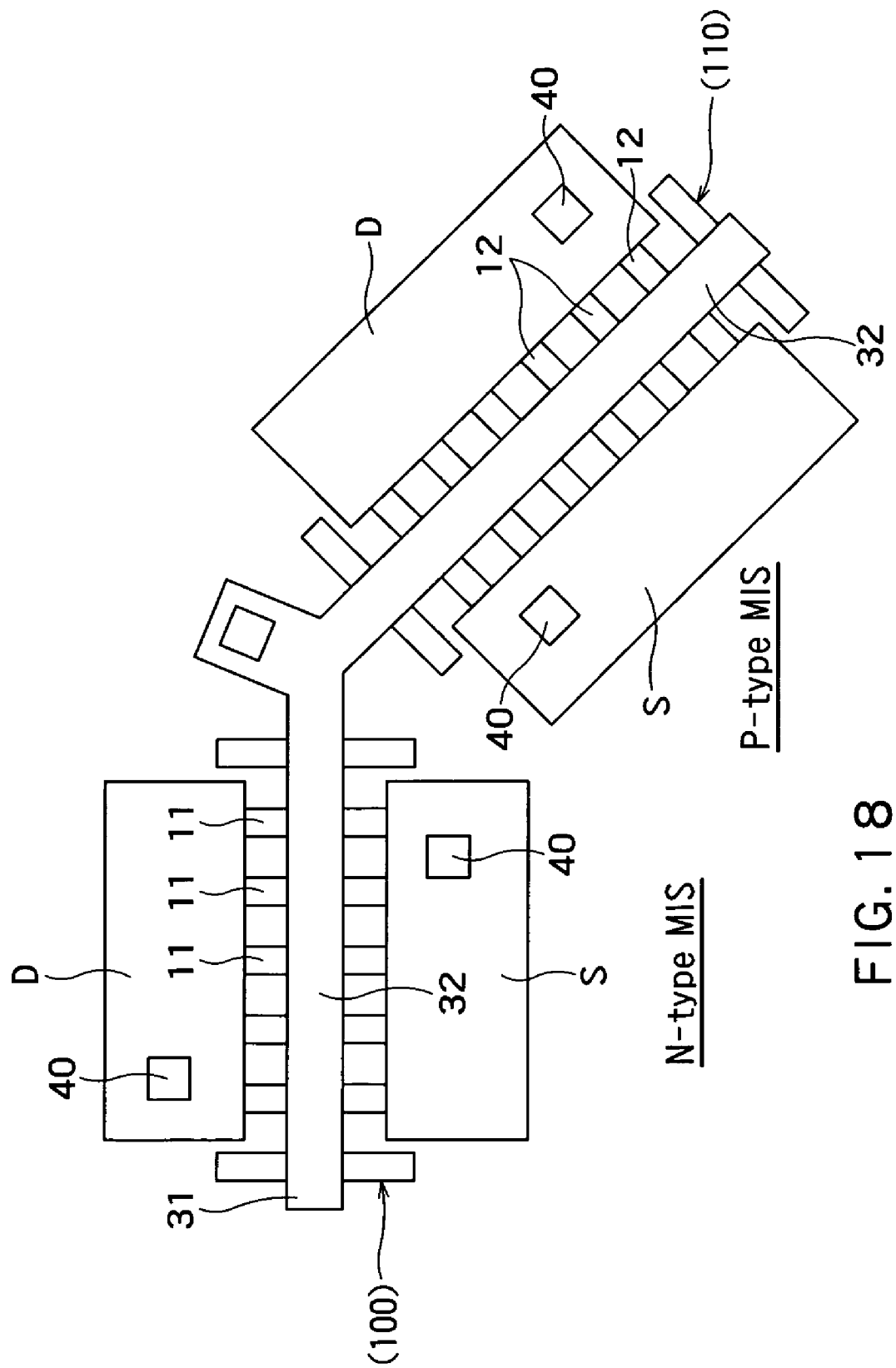
FIG. 18 is a plan view showing a modification of the first embodiment.

FIG. 18 is a plan view which shows a modification of the first embodiment. In the first embodiment, each side surface (channel surface) of the first fin 11 and the second fin 12 is (100) orientation. As shown in FIGS. 3 and 4, in the NMOSFET, carrier mobility of (100) channel surface is higher than that of (110) channel surface. However, in the case of the PMOSFET, carrier mobility of (110) channel surface is higher than that of (100) channel surface.

Therefore, as shown in FIG. 18, in a plane parallel to the surface of the semiconductor substrate, the second fin 12 is twisted through 45 degrees with respect to the first fin 11. As a result of this, because the side surfaces of the second fin 12 are (110) orientation, the carrier mobility of the PMOSFET can be improved.

Second Embodiment

Figure 19:
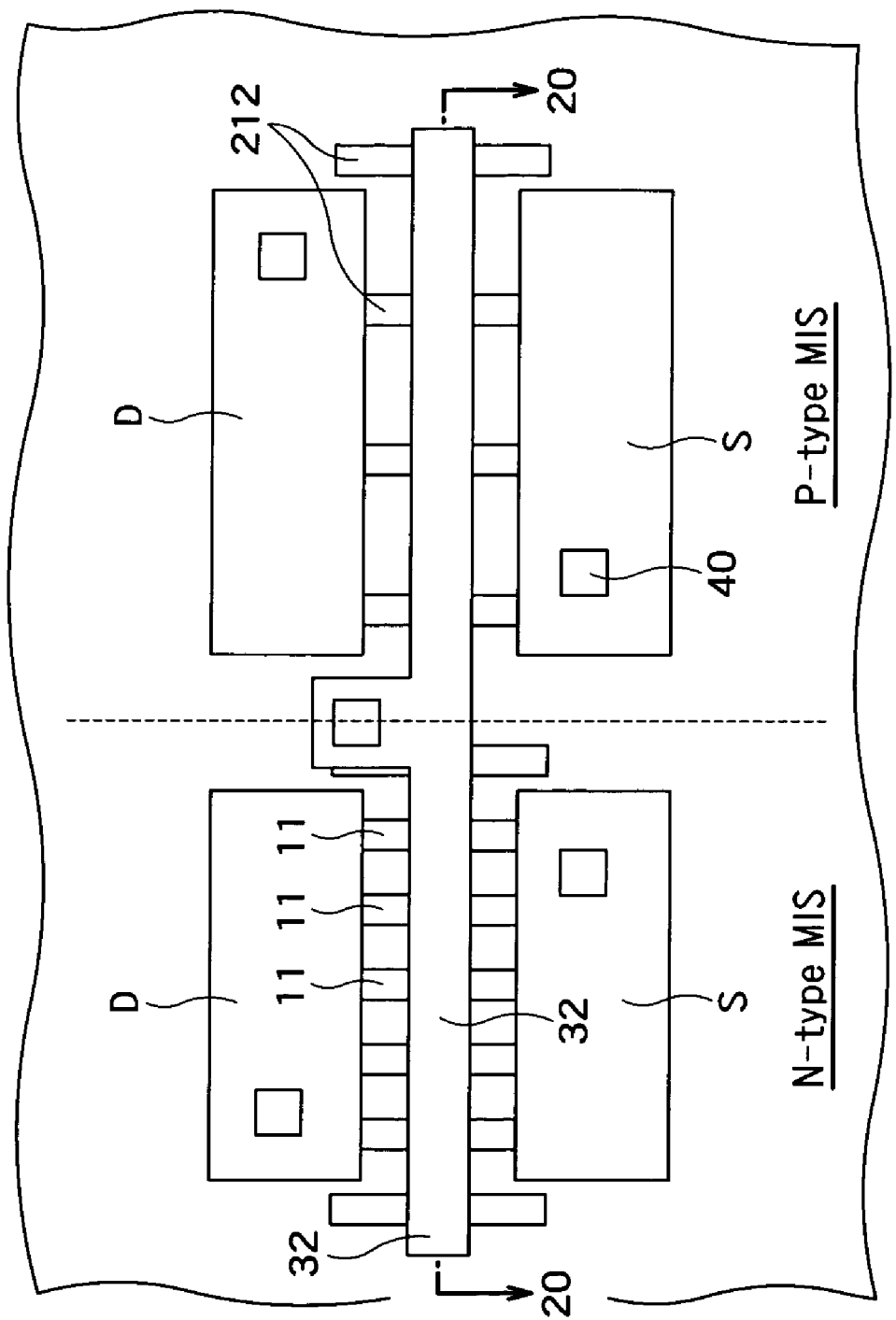
FIG. 19 is a plan view of a FinFET according to a second embodiment.
Figure 20:
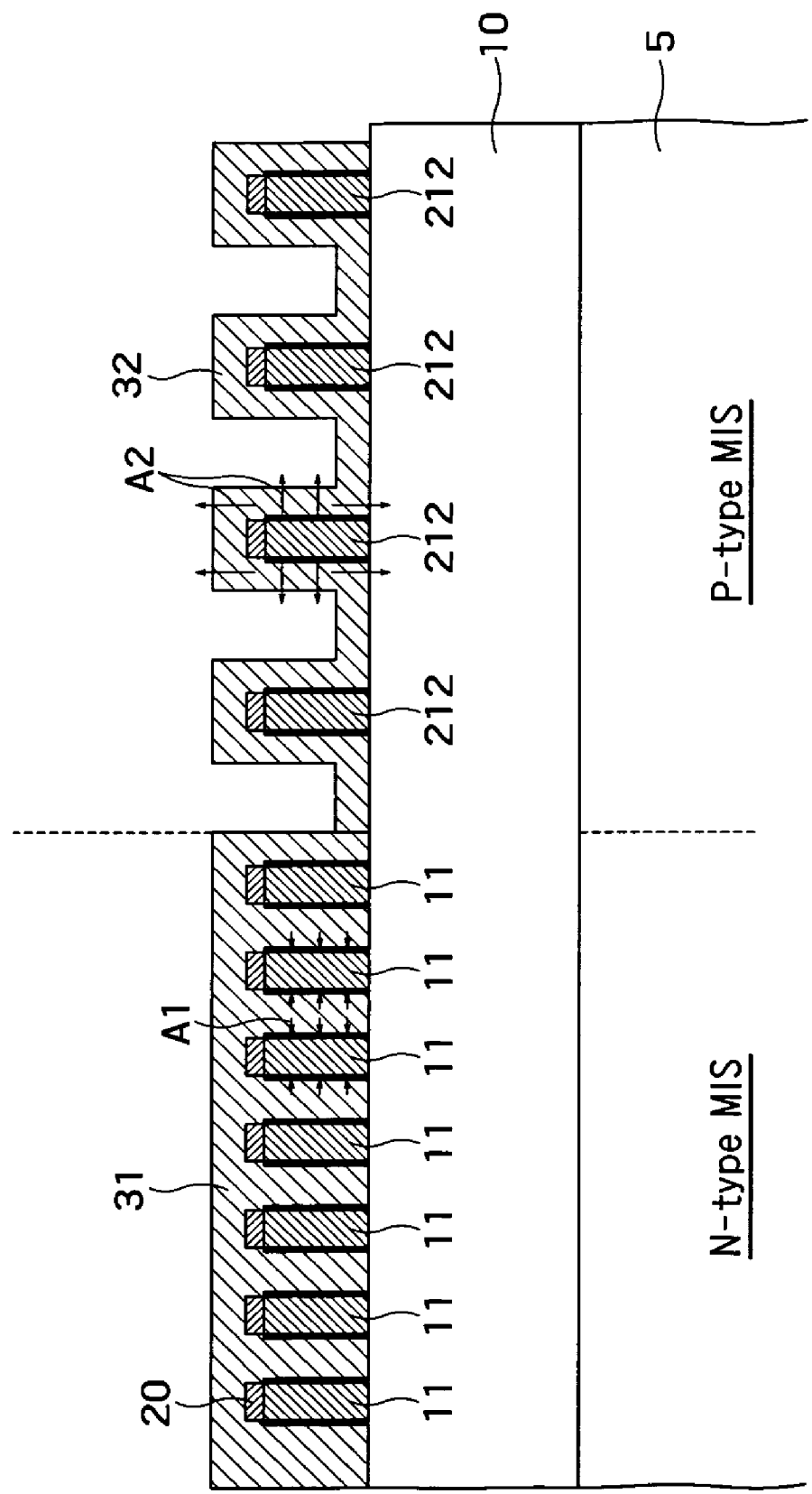
FIG. 20 is a cross-sectional view taken along the line 20-20 of FIG. 19.

FIG. 19 is a plan view of a FinFET in second embodiment of the present invention. FIG. 20 is a cross-sectional view taken along the line 20-20 of FIG. 19. With reference to FIGS. 19 and 20, the FinFET of the second embodiment will be described. The second embodiment differs from the first embodiment in that the spacing between second fins 212 which are adjacent to each other is wider than the spacing between first fins 11 which are adjacent to each other. Other structural features of the second embodiment may be the same as those of the first embodiment.

By making the spacing between the second fins 212 larger than the spacing between the first fins 11, it is possible to form a first gate electrode 31 which fills the spacing between the first fins 11 and a second gate electrode 32 which does not fill the spacing between the second fins 212 in same process step.

Figure 21:
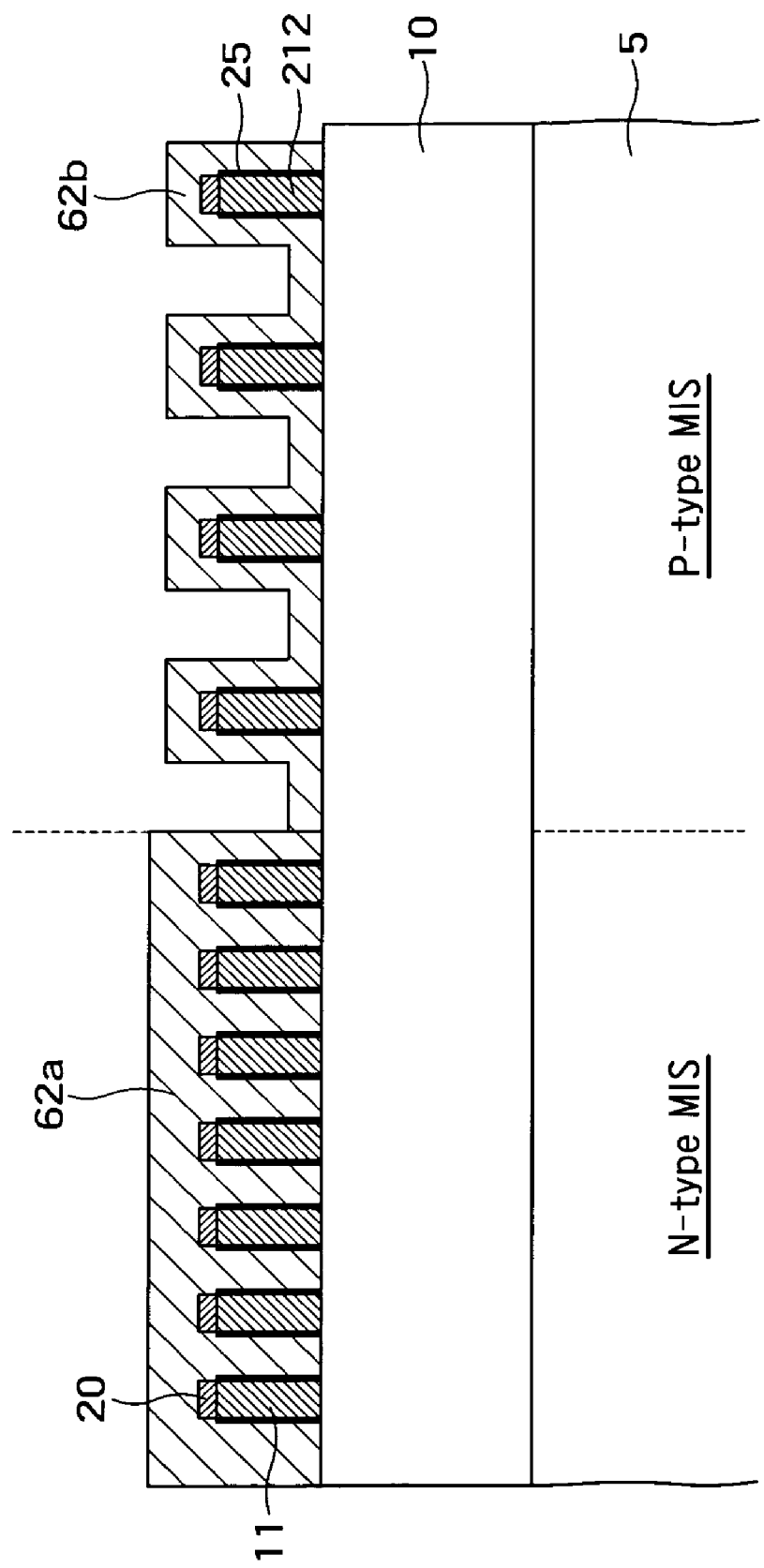
FIGS. 21 and 22 are cross-sectional views showing a method of manufacturing a FinFET according to the second embodiment, and following the step shown in FIG. 13.
Figure 22:
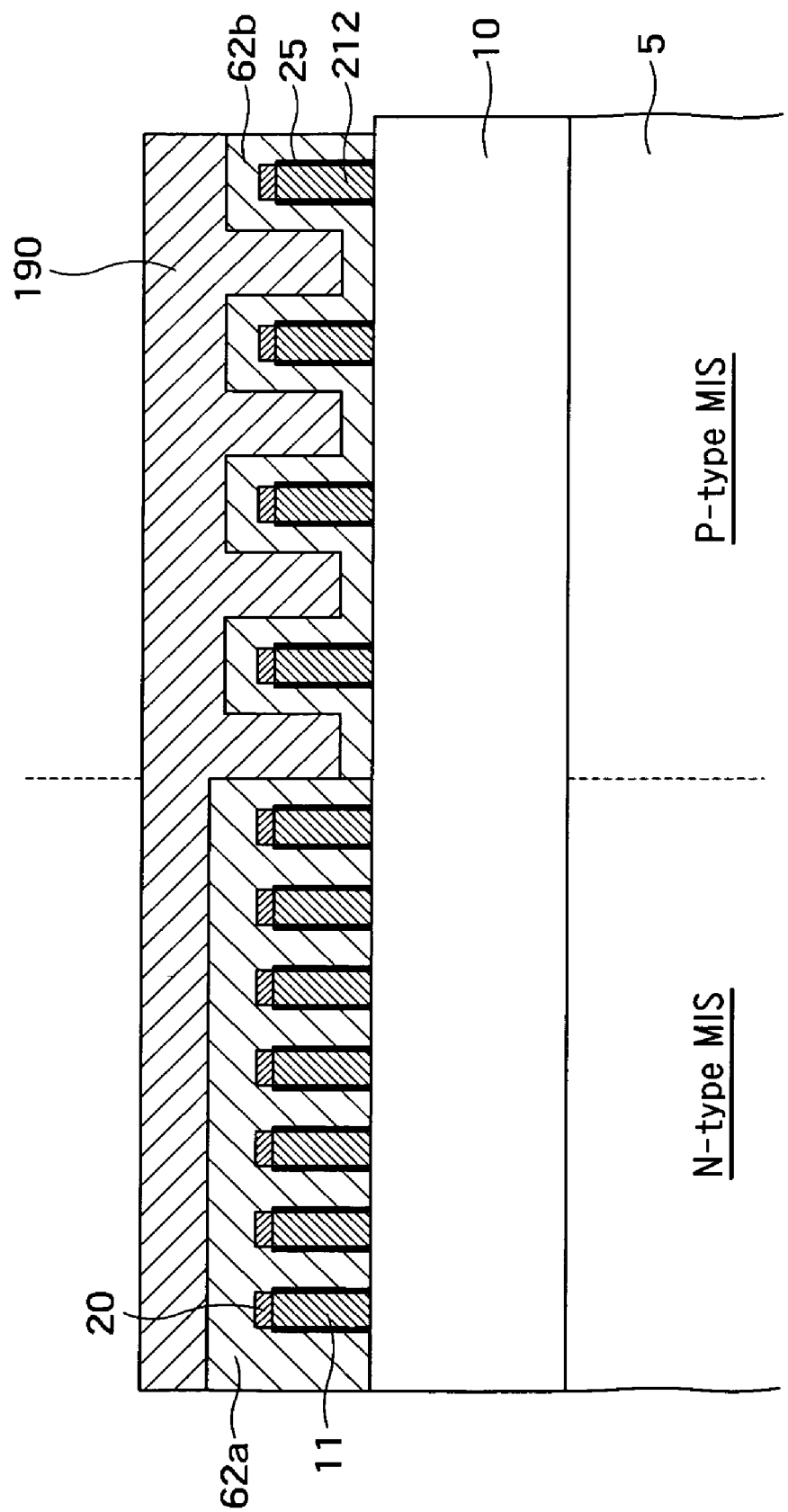

A method of manufacturing a FinFET in the second embodiment will be described below. First, the structure shown in FIG. 13 is obtained by using the same steps as in the first embodiment. The manufacturing steps after the step shown in FIG. 13 will be described by referring to FIGS. 21 and 22. FIGS. 21 and 22 correspond to cross-sectional views taken along the line 14-14 of FIG. 13. However, to facilitate understanding, in FIGS. 21 and 22, the number of fins is made larger than the number of fins shown in FIG. 13 and NMOSFETs and PMOSFETs are separately shown. From the state of FIG. 13, the gate polysilicon 62 is removed by CDE and the like. Gate oxide films and gate electrodes 62 (62a, 62b) are formed in the trenches (FIG. 21).

The film thickness of the gate electrode material 62b is not less than ½ of the spacing between the first fins 11 which are adjacent to each other and less than ½ of the spacing between the second fins 212 which are adjacent to each other. The excess gate electrode material deposited outside the trench on the TEOS is removed by CMP, lithography and RIE. In this embodiment, the gate electrodes 62a and 62b can be simultaneously formed.

Next, as shown in FIG. 22, a metal film 190 is deposited on the gate electrode material 62b. Furthermore, by performing heat treatment, the metal film 190 and the gate electrode material 62b react with each other. At this time, the substantial whole of the gate electrode materials 62a and 62b is silicided, whereby a first gate electrode 31 and a second gate electrode 32 are formed. The structure shown in FIG. 20 is obtained in this manner.

In the second embodiment, in the same manner as in the first embodiment, the first gate electrode 31 gives a compressive stress to side surfaces of the first fin. The second gate electrode 32 gives a tensile stress to side surfaces of the second fin. Therefore, the second embodiment has effects similar to those of the first embodiment.

Additionally, in the second embodiment, the spacing between the second fins 212 is wider than the spacing between the first fins 11. Therefore, by depositing the gate electrode material 62b having a thickness which is not less than ½ of the spacing between the first fins 11 and less than ½ of the spacing between the second fins 212, it is possible to fill the spacing between the first fins 11 with the gate electrode material 62b, and at the same time, it is possible to cause a gap to remain without filling the spacing between the second fins 212 with the gate electrode material. That is, unlike the first embodiment, in the second embodiment, it is unnecessary to remove the gate electrode material 62b in the PMOSFET region and then deposit the gate electrode material 63 again. Accordingly, in the second embodiment, a FinFET can be manufactured easily and in a shorter time than in the first embodiment.

The modification of the first embodiment is applicable also to the second embodiment.

Third Embodiment

Figure 23:
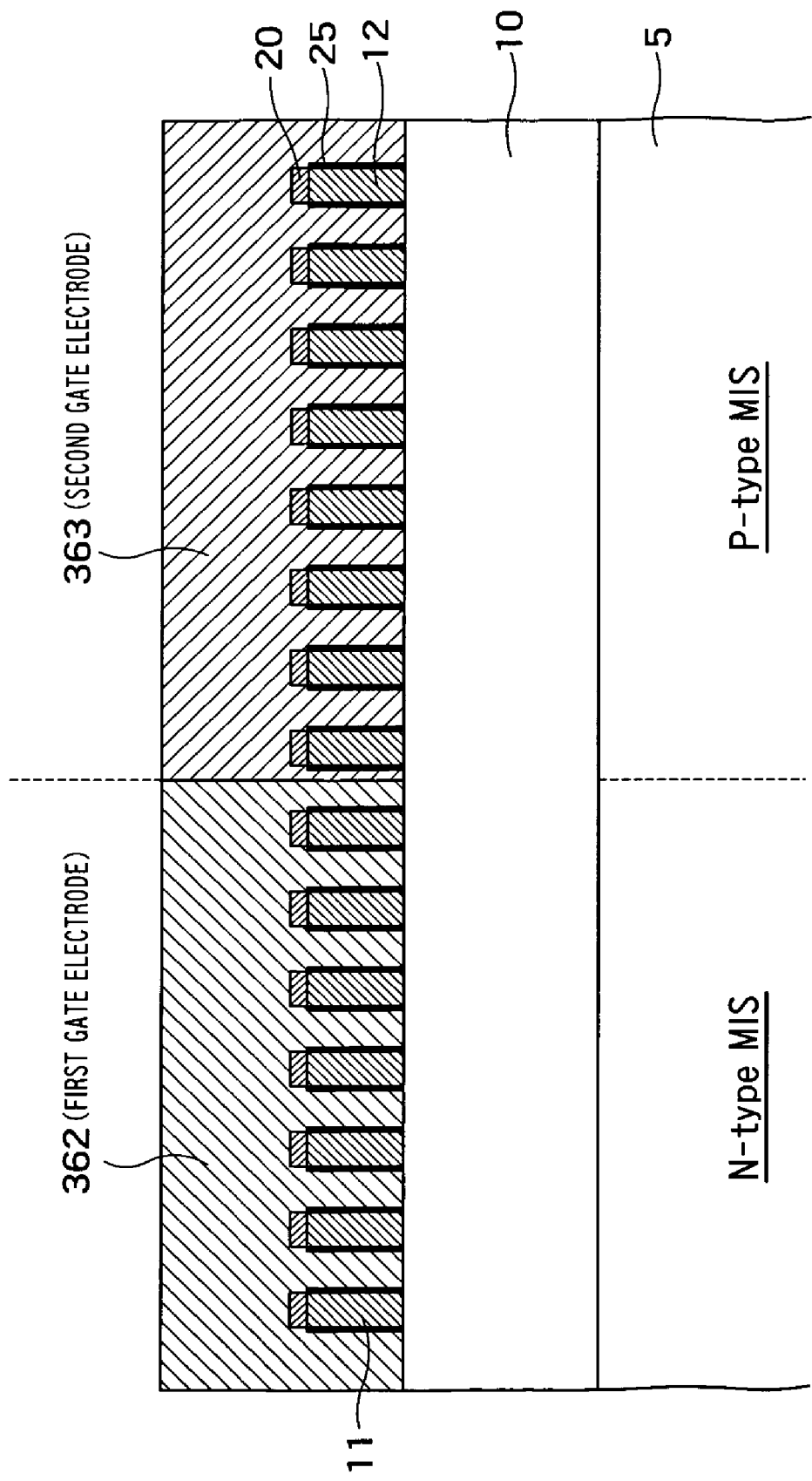
FIG. 23 is a cross-sectional view of a FinFET in the third embodiment.

FIG. 23 is a cross-sectional view of a FinFET in the third embodiment of the present invention. The third embodiment differs from the first embodiment in that a first gate electrode 362 and a second gate electrode 363 are formed by the damascene process. Other structural features of the third embodiment may be the same as those of the first embodiment.

The first gate electrode 362 is made of, for example, nickel silicide and the like. The second gate electrode 363 is made of, for example, titanium nitride, tungsten, TiSi$_2$ and the like.

A method of manufacturing a FinFET in the third embodiment will be described below. First, the structure shown in FIG. 13 is obtained by the same steps of the first embodiment. Next, the polysilicon (62) in the region where the nMOSFET is formed is removed by using CDE and the like. As a result of this, a gate trench is formed. After the formation of a gate insulating film on side surfaces within the gate trench, nickel silicide is filled in this gate trench as a material for the first gate electrode 362. Subsequently, the nickel silicide is planarized by using CMP. As a result of this, the material for the first gate electrode 362 is buried in the gate trench.

Next, the polysilicon 62 in the PMOSFET region is removed. As a result of this, a gate trench is formed in the PMOSFET region. Next, after the formation of a gate insulating film on side surfaces within the gate trench, the material for the second gate electrode 363 is filled in this gate trench. Subsequently, the material for the second gate electrode 363 is planarized by using CMP. As a result of this, the material for the second gate electrode 363 is buried in the gate trench in the PMOSFET region. By using the damascene process like this, the first gate electrode 362 and the second gate electrode 363 can be formed from different kinds of metals or silicides.

Because nickel silicide which is the material for the first gate electrode 362 is an expansive material, the nickel silicide applies a compressive stress to the side surfaces (100) of the first fin 11. On the other hand, because titanium nitride, tungsten and TiSi$_2$, which are the materials for the second gate electrode 363, are contractive materials, they apply a tensile stress to the side surfaces (100) of the second fin. Therefore, the third embodiment has effects similar to those of the first embodiment.

Moreover, because the damascene process is used in the third embodiment, not only silicides but also pure metals are available to the gate electrodes.

It is also possible to use the third embodiment in combination with the second embodiment. In this case, the third embodiment has also the effects of the second embodiments. Also, it is possible to apply the modification of the first embodiment to the third embodiment. In this case, the third embodiment has also the effects of this embodiment.

Fourth Embodiment

Figure 24:
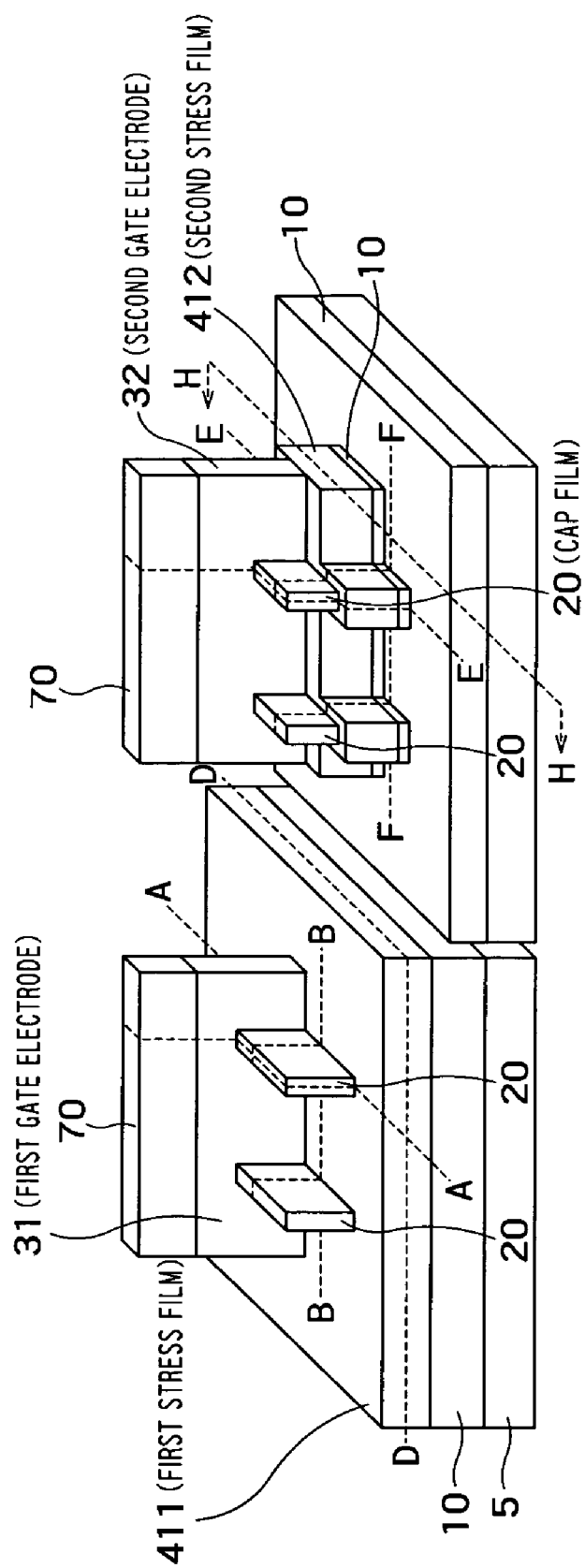
FIG. 24 is a cross-sectional view of a FinFET in the fourth embodiment.

FIG. 24 is a perspective view of a FinFET in the fourth embodiment of the present invention. The fourth embodiment differs from the first to third embodiments in that the fourth embodiment has stress films which cover the side surfaces of source and drain regions of a first fin 11 and a second fin 12. Other structural features of the fourth embodiment may be the same as those of any of the first to third embodiments. Gate electrodes 31, 32 may be formed by conventional methods.

The first and second fins 11 and 12 are not seen in the FIG. 24 because they are covered with a first stress film 411 and a second stress film 412, respectively.

Figure 25:
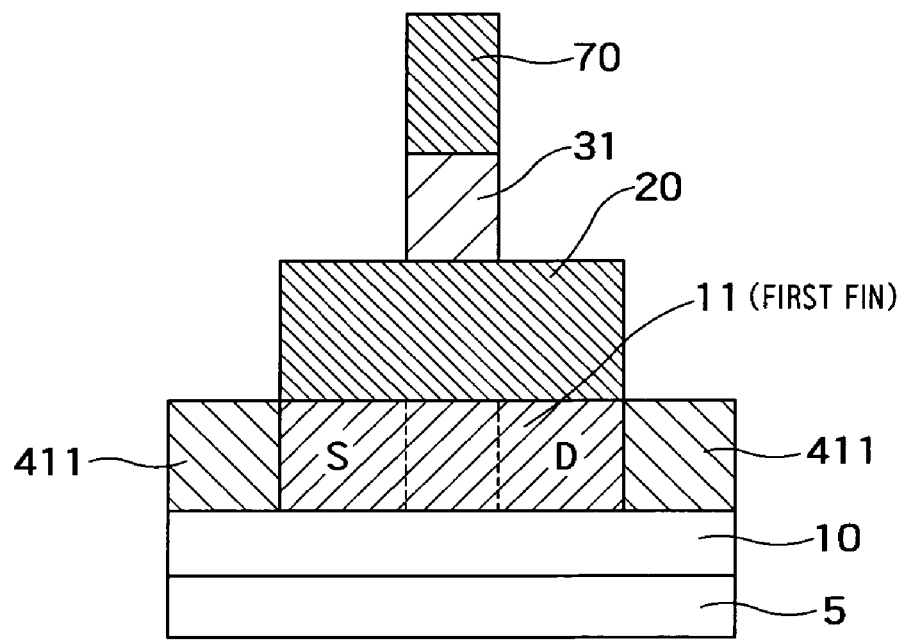
FIG. 25 is a cross-sectional view taken along the line A-A of FIG. 24.
Figure 26:
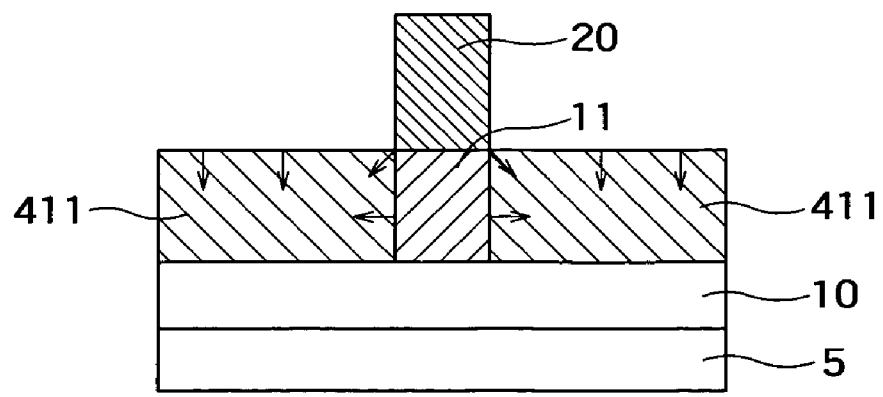
FIG. 26 is a cross-sectional view taken along the line B-B of FIG. 24.
Figure 27:
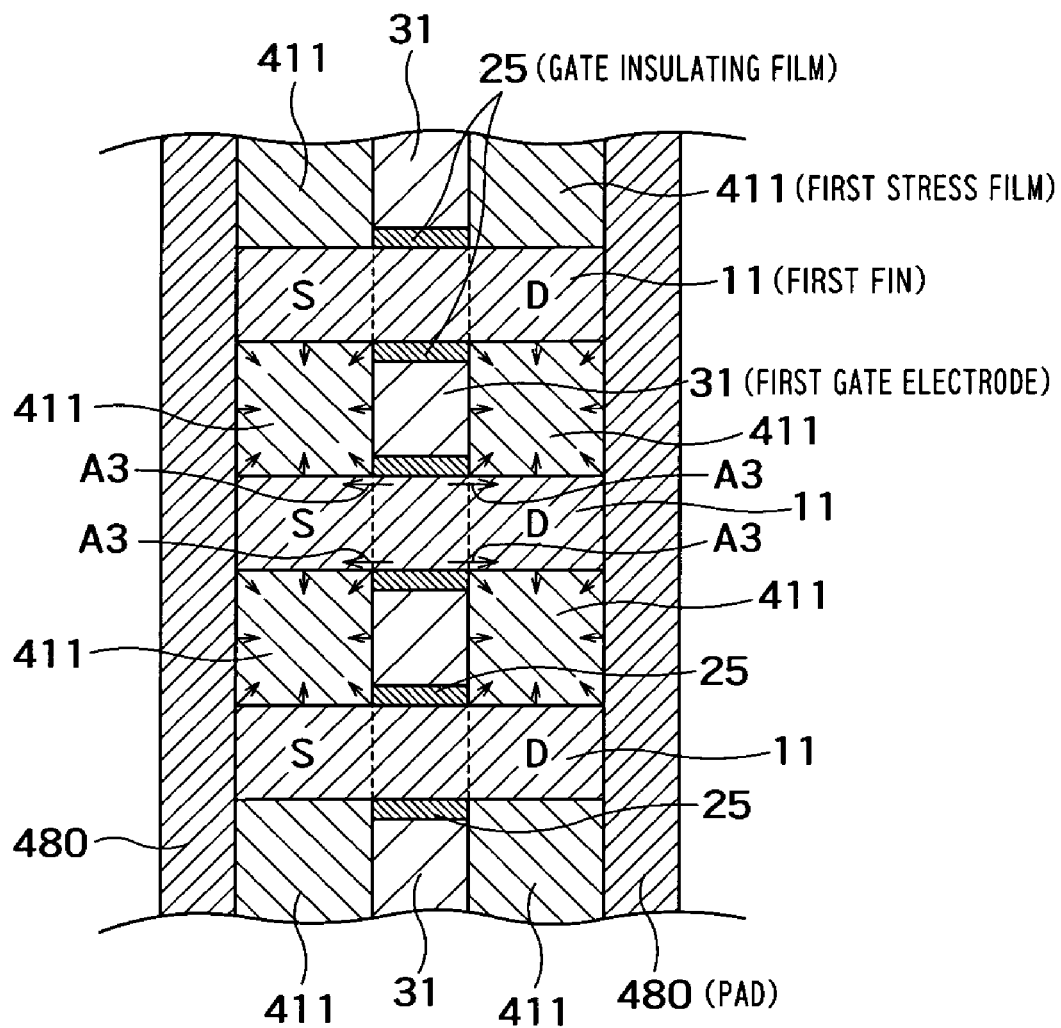
FIG. 27 is a plan view taken along the line D-D of FIG. 24.
Figure 28:
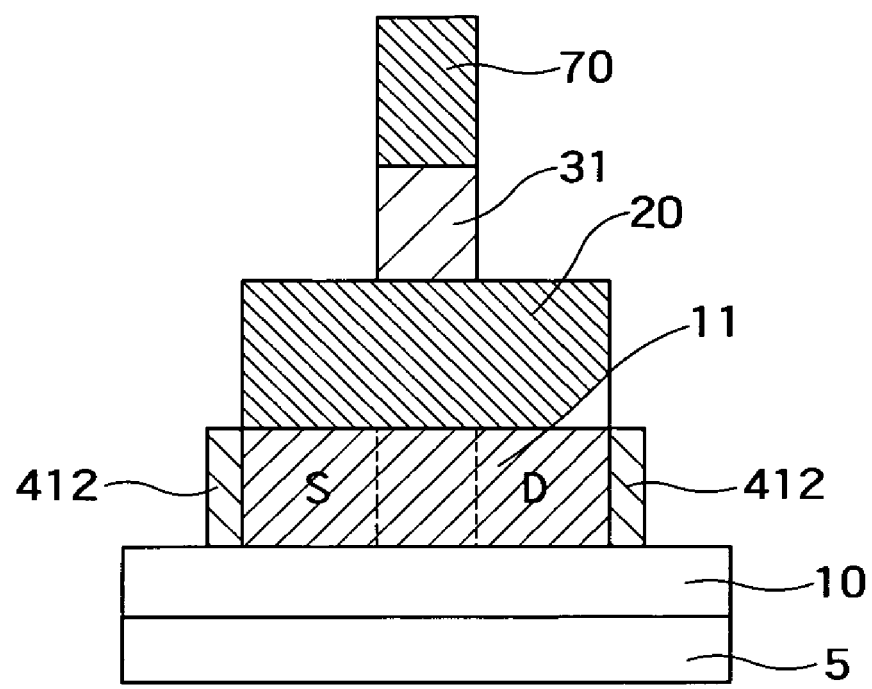
FIG. 28 is a cross-sectional view taken along the line E-E of FIG. 24.
Figure 29:
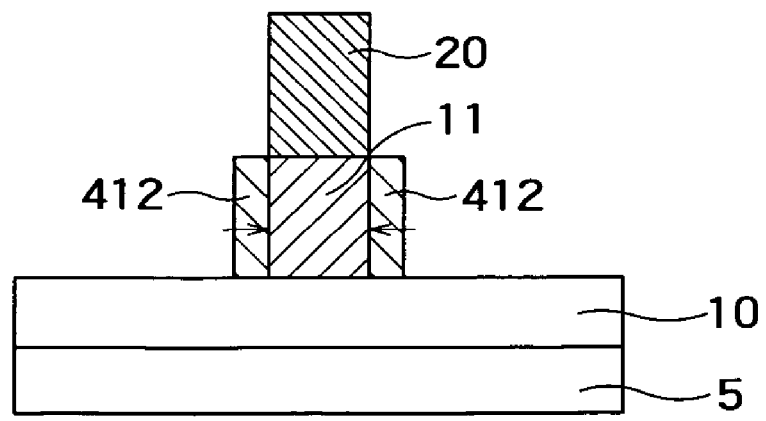
FIG. 29 is a cross-sectional view taken along the line F-F of FIG. 24.
Figure 30:
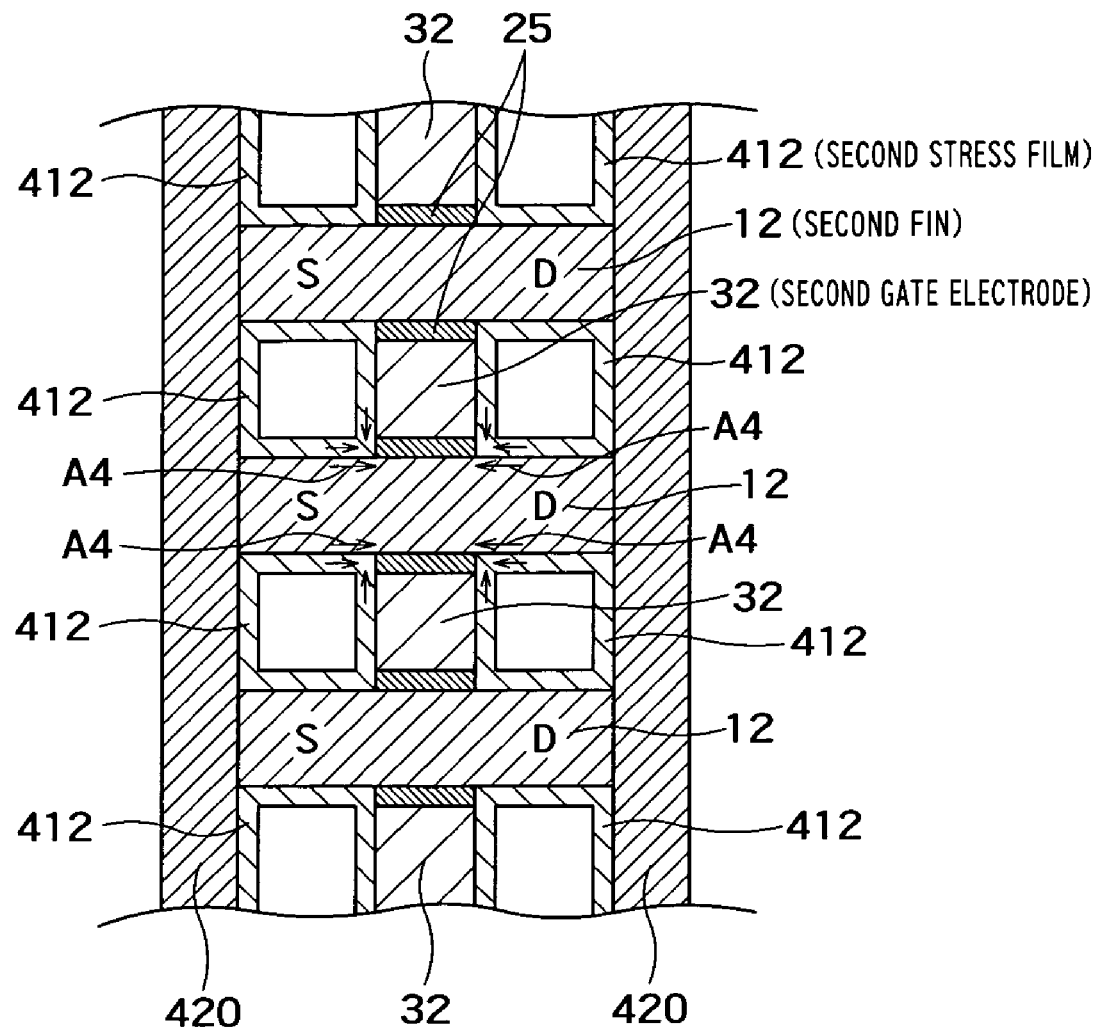
FIG. 30 is a plan view taken along the line H-H of FIG. 24.

FIG. 25 is a cross-sectional view taken along the line A-A (in the current flow direction) of FIG. 24. FIG. 26 is a cross-sectional view taken along the line B-B (in the channel width direction) of FIG. 24. FIG. 27 is a plan view taken along the line D-D of FIG. 24. FIG. 28 is a cross-sectional view taken along the line E-E (in the current flow direction) of FIG. 24. FIG. 29 is a cross-sectional view taken along the line F-F (in the channel width direction) of FIG. 24. FIG. 30 is a plan view taken along the line H-H of FIG. 24.

As shown in FIG. 24, the side surfaces of the source-drain region of the first fin 11 are covered with the first stress film 411. The side surfaces of the source-drain region of the second fin 12 are covered with the second stress film 412. The first stress film 411 and the second stress film 412 are made of, for example, a silicon nitride film (plasma nitride film). The first stress film 411 and the second stress film 412 which are shown in FIG. 24 respectively cover the fins 11, 12. However, for example, to weaken the stress, the silicon nitride film may be formed thin. Conversely, by thickening the first stress film 411 and the second stress film 412, it is also possible to obtain process margins.

The first stress film 411 is filled between first fins 11 which are adjacent to each other. On the other hand, the second stress film 412 is not filled between first fins 12 which are adjacent to each other, and is provided in thin film form on the side surfaces of the second fin 12. Therefore, there is a gap between the second fins 12 which are adjacent to each other.

FIG. 25 shows a cross-sectional view of the first fin 11 along the length direction of the channel (the source-drain direction). It can be seen that the first fin 11 is under a cap film 20.

FIG. 26 shows a cut surface of the first fin 11 along the width direction of the channel. In FIG. 26, the first stress film 411 is adjacent to the source-drain region S, D of the side surfaces of the first fin 11. The arrows shown in FIG. 26 indicate the direction of stresses. In this embodiment, the plasma nitride as the material for the first stress film 411 is a contractive material. The plasma nitride can be made of a contractive material depending on film forming conditions.

As shown in the plan view of FIG. 27, the first stress film 411 is filled between the fins 11 which are adjacent to each other. In further detail, the first stress film 411 is filled in a region enclosed by the source S (or the drain D), the first gate electrode 31 and a pad 480. As a result of this, when the first stress film 411 contracts, the first stress film 411 stretches the first fin 11 in the current flow direction (the direction of the arrow A3). As shown in FIG. 1A, carrier mobility is enhanced when the fin of the NMOSFET is stretched in the length direction (S2) of the channel. Therefore, by using the first stress film 411, the carrier mobility of the NMOSFET in the fourth embodiment is improved.

FIG. 28 shows a cut surface of the second fin 12 along the current flow direction (the source-drain direction). It can be seen that the second fin 12 is present under the cap film 20. The second stress film 412 is adjacent to the two side surfaces of the second fin 12. The second stress film is in thin film form. The film thickness of the second stress film 412 is less than ½ of the spacing between the second fins 12 which are adjacent to each other, and the thicker the second stress film, the larger effect on a mobility improvement will be obtained. However, if the film thickness of the second stress film 412 is excessively increased, the area occupied by a CMOS increases because it is necessary to widen the spacing between the fins 12. Therefore, the film thickness of the second stress film 412 is typically about 2 to 100 nm, more preferably about 5 to 30 nm. When a large area occupied by a CMOS is permitted in terms of design, the thicker film is preferable.

FIG. 29 shows a cut surface of the second fin 12 along the width direction of the channel. In FIG. 29, the second stress film 412 is adjacent to the source-drain region S, D of the side surfaces of the second fin 12.

As can be seen by referring to the plan view of FIG. 30, the second stress film 412 is not filled between the fins 12 which are adjacent to each other. In further detail, the second stress film 412 is provided in thin film form on the side surfaces of the source S (or the drain D), the second gate electrode 32 and a pad 420. Therefore, stresses acting between the second fins 12 adjoining each other and stresses acting between the second gate electrode 32 and the pad 420 are small, and stresses acting on each other between the fin 12 and the second gate 32 are relatively large. As a result of this, when the second stress film 412 itself contracts, the second stress film contracts the second fin 12 in the current flow direction (the direction of the arrow A4).

As shown in FIG. 1, carrier mobility is enhanced when the fin of the PMOSFET is compressed in the length direction of the channel (S2). Therefore, by using the second stress film 412, the carrier mobility of the PMOSFET in the fourth embodiment is improved.

As described above, although the first stress film 411 and the second stress film 412 are made of the same material, because of their difference in film thickness, the first stress film 411 and the second stress film 412 apply different stresses respectively to the first and second fins 11 and 12. As a result of this, in the fourth embodiment, it is possible to improve the carrier mobility of both the nMOSFET and the pMOSFET.

By combining the fourth embodiment and any of the first to third embodiments, it is possible to further improve the carrier mobility.

A method of manufacturing a FinFET in the fourth embodiment will be described. First, the structure shown in FIG. 11 is obtained by using the same steps as in the first embodiment. The manufacturing steps after the step shown in FIG. 11 will be described by referring to FIGS. 31 to 35.

Figure 31:
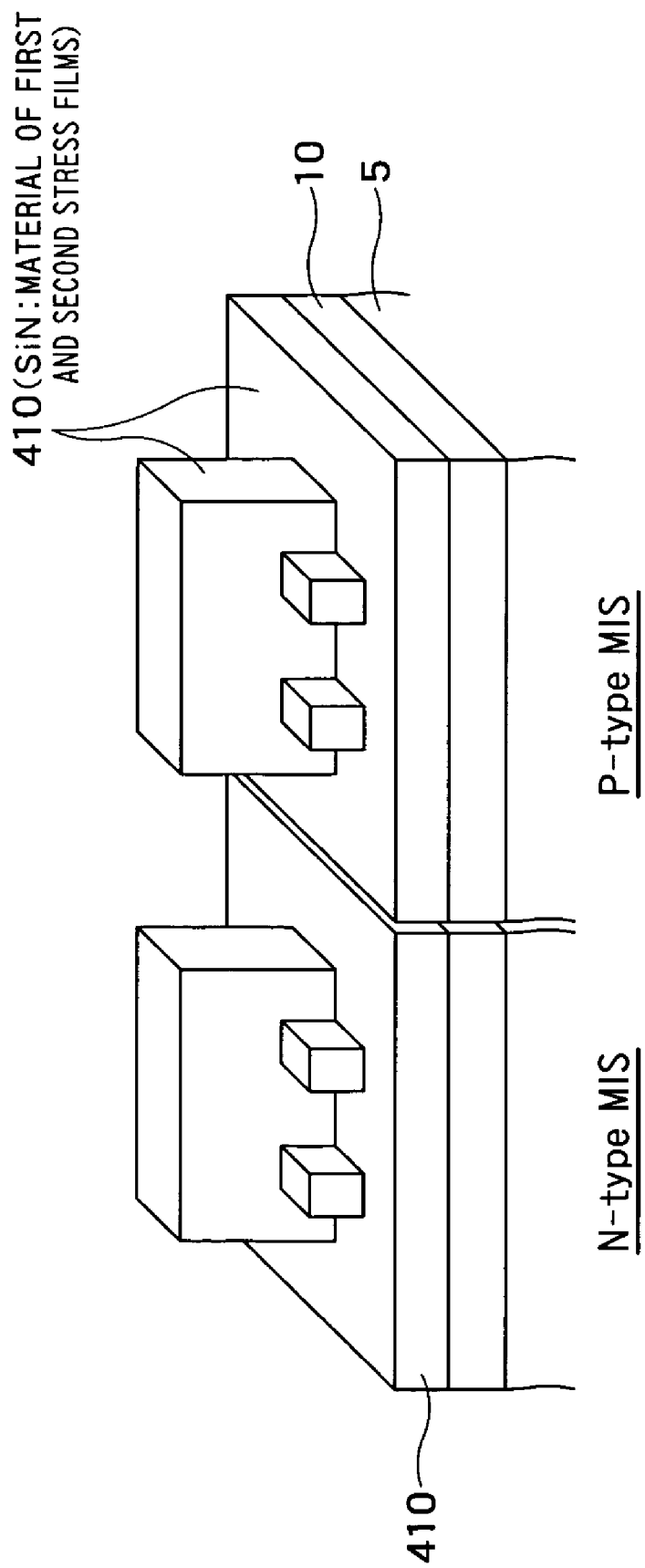
FIGS. 31 to 35 are cross-sectional views showing a method of manufacturing a FinFET according to the fourth embodiment.

As shown in FIG. 31, a silicon nitride film 410 which is a contractive material is deposited in a thickness of about 60 nm by using the HDP (high-density plasma)-CVD process. The silicon nitride film 410 is deposited, for example, in a mixed atmosphere of $SiH_4$, $NH_3$, Ar and $N_2$, at an atmospheric pressure of 5 torrs and at a substrate temperature of about 400° C. At this time, a plasma is generated by adding a high-frequency electric field by use of a high-frequency oscillator of 13.56 MHz and 1200 W, whereby the material gas is excited. This enables the raw material gas to undergo chemical reactions and to deposit a silicon nitride film. A silicon nitride film which is deposited in this manner is called a plasma nitride. The plasma nitride can become contractive or expansive by changing the composition of the raw material gas and the atmospheric pressure.

Compared to the thermal CVD process, a silicon nitride film can be deposited anisotropically by the HDP-CVD process. For example, in the HDP-CVD process, it is possible to deposit a relatively thin silicon nitride film on a surface perpendicular to a semiconductor substrate such as on side surfaces of a gate electrode and to deposit a relatively thick silicon nitride film on a surface parallel to the semiconductor substrate. For example, in the HDP-CVD process, it is possible to deposit a silicon nitride film having a film thickness of not more than 10 nm on a surface perpendicular to a semiconductor substrate and to deposit a silicon nitride film of 60 nm on a surface parallel to the semiconductor substrate.

Figure 32:
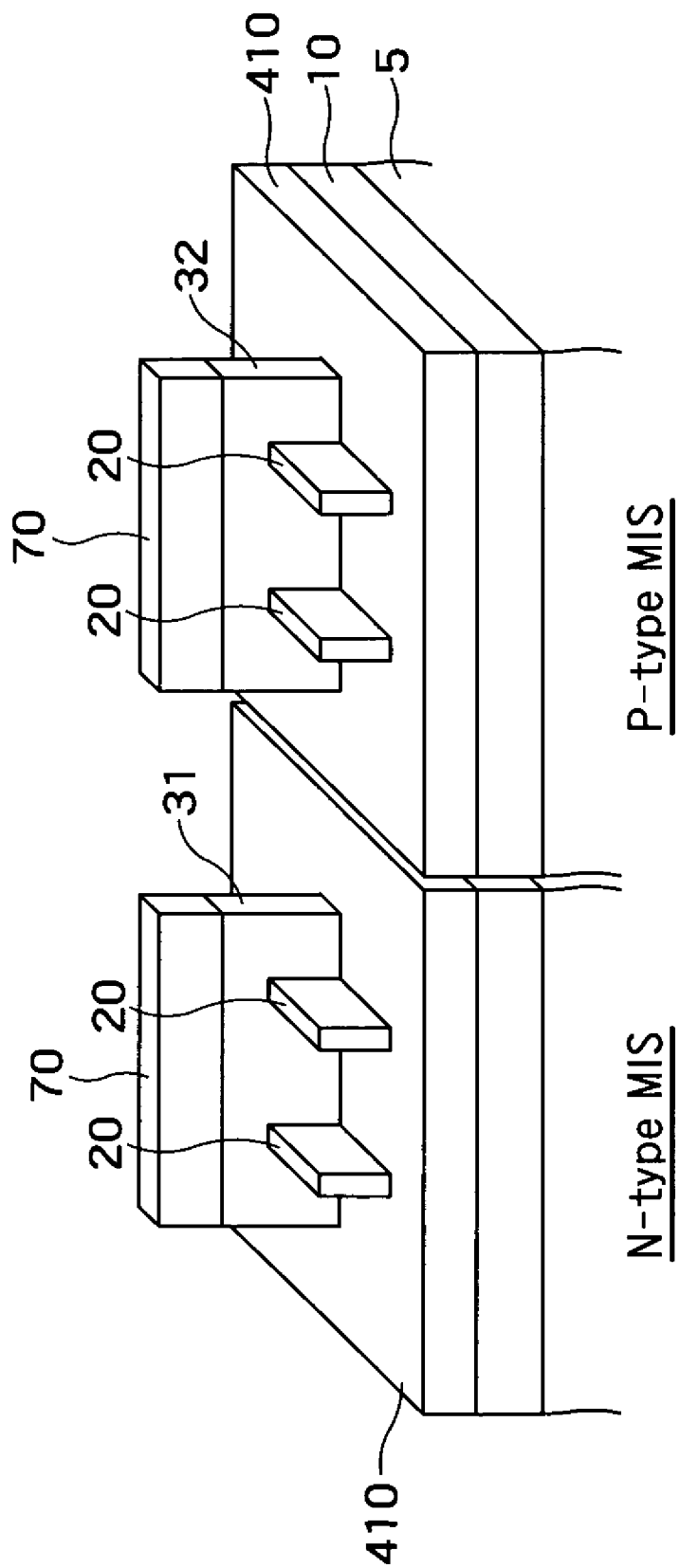

Next, the silicon nitride film 410 is etched back by about 10 nm by using a hot phosphoric acid solution. After the silicon nitride film 410 deposited on the surface perpendicular to the semiconductor substrate is removed, as shown in FIG. 32, the side surfaces of the first gate electrode 31 and the second electrode 32 appear. At this time, because the silicon nitride film 410 of about 50 nm remains on an insulating layer 10, the first fin 11 and the second fin 12 do not appear.

The etching rate of the plasma nitride by the hot phosphoric acid solution is about 5 to 15 times faster than that of the silicon nitride film formed by the thermal CVD process. Therefore, it is possible to remove only the silicon nitride film 410 while remaining a cap film 20 and a protective film 70.

Next, the semiconductor substrate is annealed in a nitrogen atmosphere at 700° C. for 30 seconds. This process stabilizes the film quality of the silicon nitride film (plasma nitride).

Next, a silicon oxide film 420 is deposited in a thickness of about 30 nm. For example, the silicon oxide film 420 can be deposited in an atmosphere of TEOS ($Si(OC_2H_5)_4$) at an atmospheric pressure of 1 torr and at a temperature of 600° C. by using the thermal CVD process. In order to ensure that a second stress film 412 formed by the silicon nitride film 410 gives a sufficient stress to the channel region, it is preferable that the film thickness of the silicon nitride film 420 is not less than 5 nm. In order to prevent FETs which are adjacent to each other from having an effect on each other, it is preferable that the film thickness in the spacing between fins and film thickness in the spacing between gates adjoining each other are not more than 60 nm.

The silicon oxide film 420 may be deposited by using other organic precursors, halides and hydrides in place of the above-described TEOS. BTBAS ($SiH_2[N\{C(CH_3)_3\}_2]$) and TDMAS ($Si[N(CH_3)_2]_2$) may be used as organic materials. $SiH_2Cl_2$, $SiCl_4$, $Si_2Cl_6$ and $SiF_4$ may be used as halogen materials. $SiH_4$ may be used as a hydrogen compound material. As the atmosphere, a simple gas or a mixed gas selected from $O_2$, $H_2O$, $N_2O$ and the like may be appropriately used according to the raw material or deposition temperature.

The silicon oxide film 420 may also be deposited by the ALD (atomic layer deposition) process by using TEOS and $H_2O$.

Figure 33:
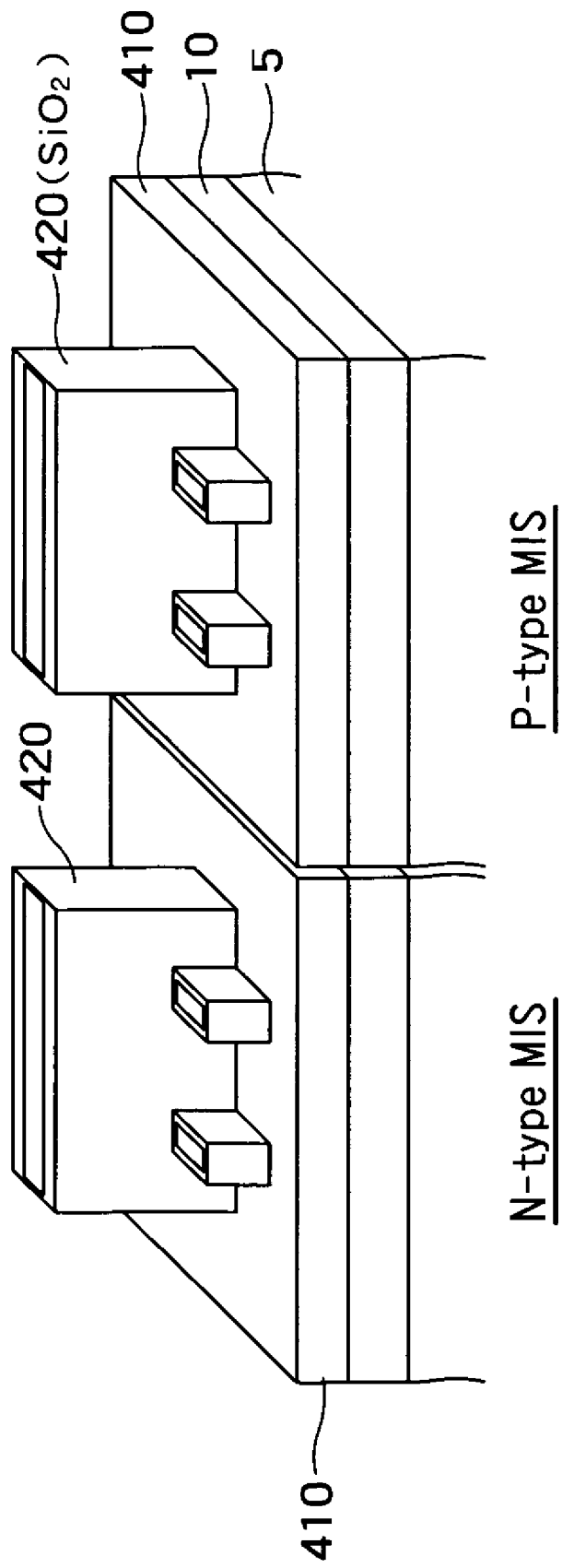

Next, the silicon oxide film 420 is etched back by the RIE process. At this time, as shown in FIG. 33, the silicon oxide film 420 remains as side wall films on each side surface of the first fin 11, the second fin 12, the first gate electrode 31 and the second gate electrode 32.

Figure 34:
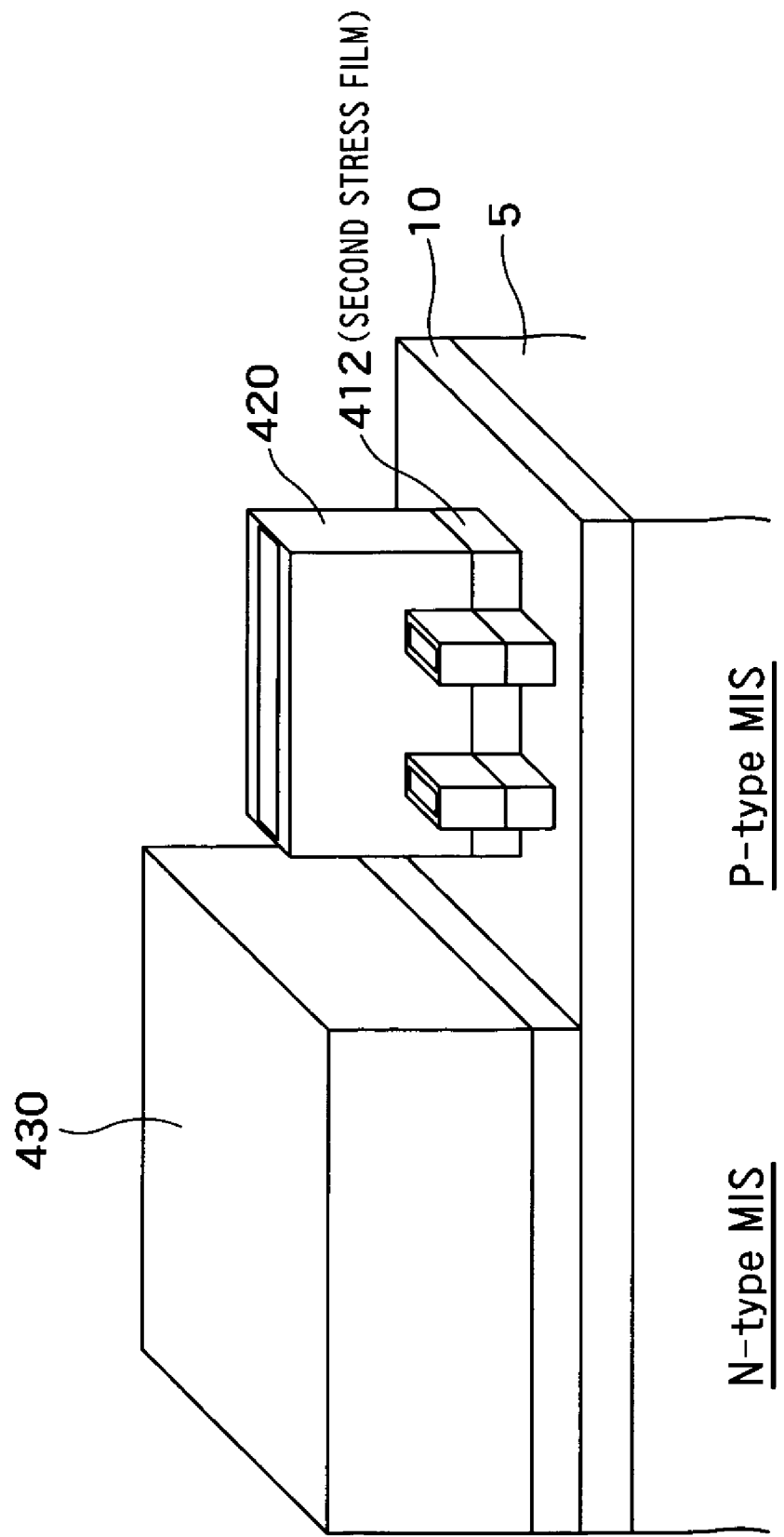

Next, the nMOSFET region is covered with a photoresist 430 by the lithography process. Subsequently, as shown in FIG. 34, the silicon oxide film 410 is etched by RIE by using the silicon oxide film 420 as a hard mask. As a result of this, the second stress film 412 made of a silicon oxide film is formed around the second fin 12 and around the lower part of the second gate electrode 32. The film thickness of the second stress film 412 is less than ½ of the spacing between the second fins 12 which are adjacent to each other.

Figure 35:
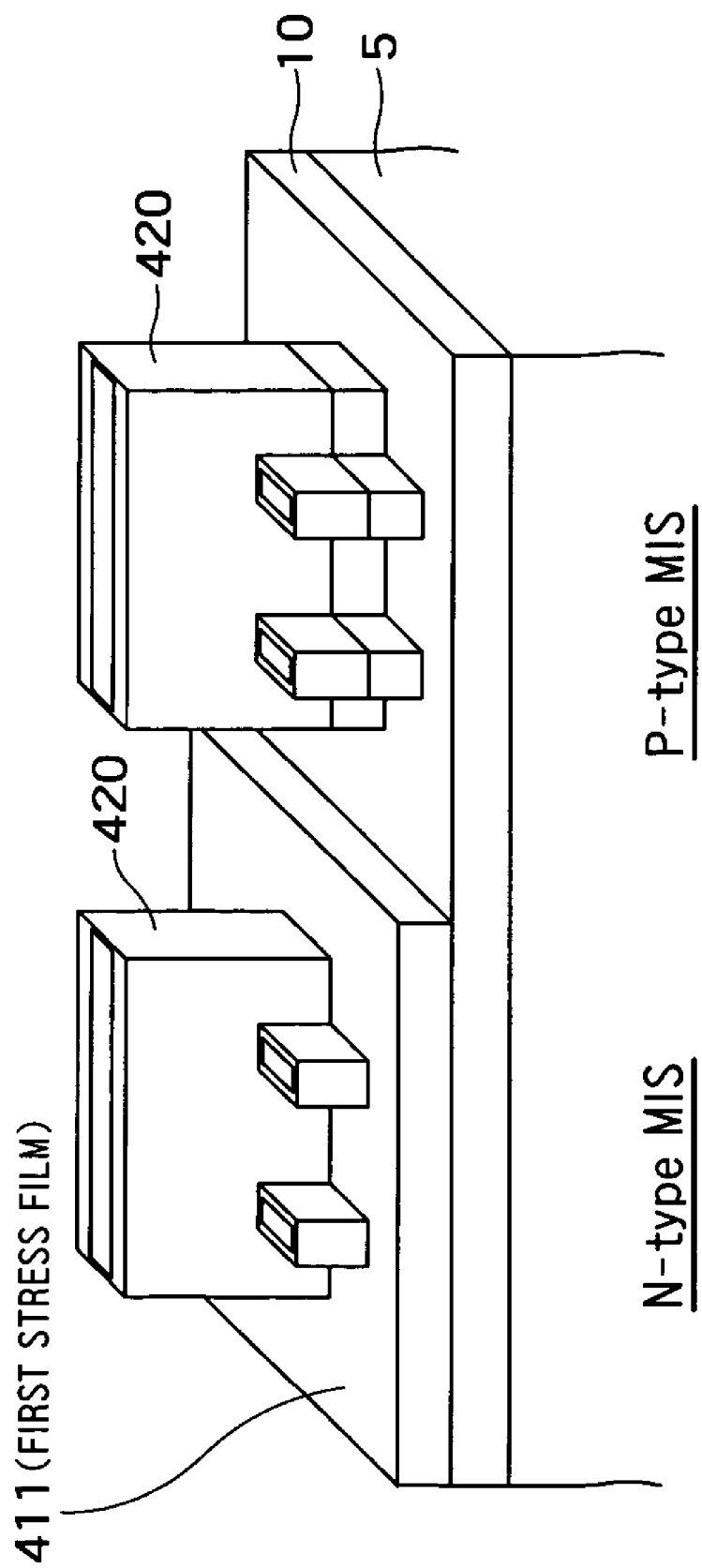
Figure 36:
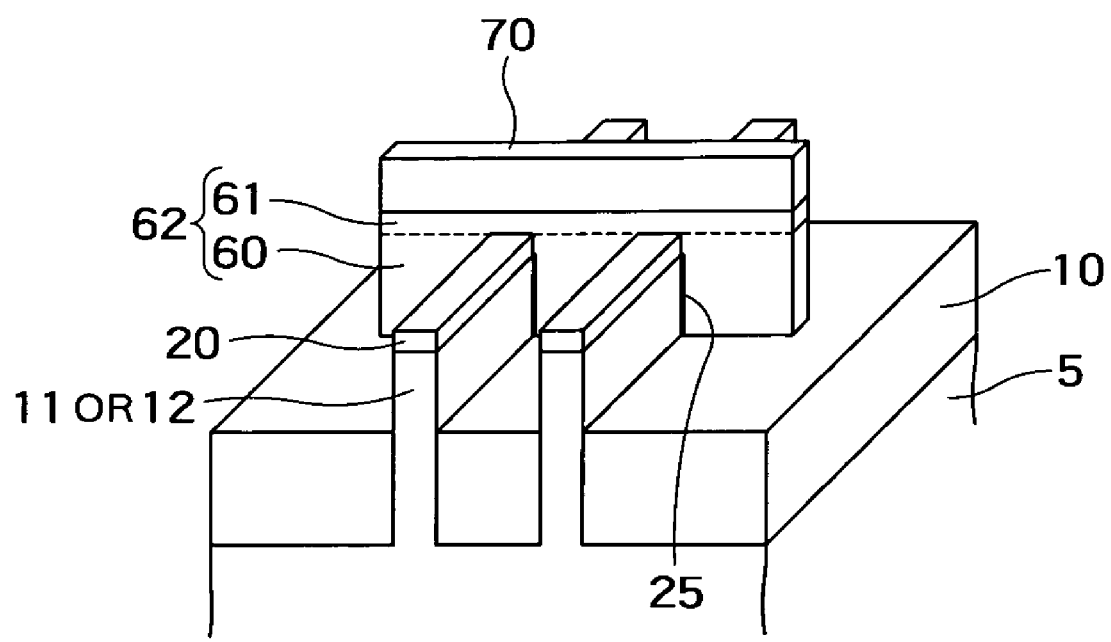
FIG. 36 shows a cross-sectional view of a FinFET according to a modification of the first to fourth embodiments.

The structure shown in FIG. 35 is obtained after removing the photoresist 430. Furthermore, the silicon oxide film 420 is removed by a hydrofluoric acid solution. Because the second stress film 412 is formed by using the silicon oxide film 420 as a hard mask, the film thickness of the second stress film 412 is almost equal to the film thickness of the silicon oxide film 420.

By the etching of the silicon oxide film 420, an insulating layer of the pMOSFET region is etched, for example, by 30 nm. As a result of this, the structure shown in FIG. 24 is obtained. At this time, because an insulating layer 10 under the second stress film 412 is removed, the stress of the second stress film 412 is easily induced to the channel region. If the insulating layer 10 is excessively removed, there is a risk that the pMOSFET itself may be lifted off. Therefore, it is preferable that the film thickness of the insulating layer 10 which is etched is of the same order of the film thickness of the second stress film 412.

Next, a cap film 20 is removed. Ion implantation is preformed on source-drain region. Then, a suicide is formed on the source-drain region. After that, an interlayer dielectric film, interconnections and the like are formed by the same steps as in the first embodiment, whereby a FinFET is completed.

In the nMOSFET, the first stress film 411 is filled between the first fins 11 which are adjacent to each other and, therefore, the first stress film 411 stretches the first fins 11 in the channel length direction. On the other hand, in the pMOSFET, the second stress film 412 is formed in a film thickness which is less than ½ of the spacing between the second fins 12 which are adjacent to each other and is not filled between the second fins 12. Therefore, the second stress film 412 compresses the second fins 12 in the channel length direction. As a result of this, it is possible to improve the carrier mobility of both of the nMOSFET and the pMOSFET.

In the fourth embodiment, the first stress film 411 and the second stress film 412 are made of the same material. This enables the above-described conventional problems to be solved.

Incidentally, as shown in FIGS. 1 and 2, this embodiment can be effective in both cases of a <100> notch wafer and a <110> notch wafer.

Modification of Fourth Embodiment

In this modification, an expansive plasma nitride is adopted as the silicon nitride film 410. In this case, it is necessary only that the structure of the nMOSFET in the fourth embodiment is used in the pMOSFET and that the structure of the PMOSFET is used in the nMOSFET. That is, in the nMOSFET, the first stress film 411 is not filled between the first fins 11 which are adjacent to each other. As a result of this, the first stress film 411 stretches the first fins 11 in the length direction of the channel. In the pMOSFET, the second stress film 412 is filled between the second fins 12 which are adjacent to each other. As a result of this, the second stress film 412 compresses the second fins 12 in the length direction of the channel.

This modification has effects similar to those of the fourth embodiment.

What is claimed is:

1. A method of manufacturing a semiconductor device comprising:
    forming a plurality of fins made of a semiconductor material on an insulating layer;
    forming a gate insulating film on side surfaces of the plurality of fins; and
    forming a gate electrode on the gate insulating film in such a manner that a compressive stress is applied to a side surface of a first fin which is used in an NMOSFET among the plurality of fins in a direction perpendicular to the side surface and a tensile stress is applied to a side surface of a second fin which is used in a PMOSFET among the plurality of fins in a direction perpendicular to the side surface,
    wherein the forming of the gate electrode comprises:
        forming the gate electrode on the gate insulating film of the first fin in a film thickness of not less than ½ of a spacing between the first fins which are adjacent to each other,
        removing the gate electrode in a region of the second fin, and
        forming the gate electrode on the gate insulating film of the second fin in a film thickness of less than ½ of a spacing between the second fins which are adjacent to each other.

2. The method of manufacturing a semiconductor device according to claim 1, wherein the side surface of the first fin and the side surface of the second fin are each a crystal plane with a (100) orientation.

3. The method of manufacturing a semiconductor device according to claim 1, wherein the side surface of the first fin is a crystal plane with a (100) orientation, and the side surface of the second fin is a crystal plane with a (110) orientation.

4. The method of manufacturing a semiconductor device according to claim 1, wherein a first gate electrode made of an expansive material is buried by a damascene process on the gate insulating film of the side surface of the first fin, and
    a second gate electrode made of a contractive material is buried by a damascene process on the gate insulating film of the side surface of the second fin.

5. A method of manufacturing a semiconductor device comprising:
    forming a plurality of fins made of a semiconductor material on an insulating layer;
    forming a gate insulating film on side surfaces of the plurality of fins; and
    forming a gate electrode on the gate insulating film in such a manner that a compressive stress is applied to a side surface of a first fin which is used in an NMOSFET among the plurality of fins in a direction perpendicular to the side surface and a tensile stress is applied to a side surface of a second fin which is used in a PMOSFET among the plurality of fins in a direction perpendicular to the side surface,
    wherein a spacing between the second fins which are adjacent to each other is larger than between the first fins which are adjacent to each other, and
    in the formation of the gate electrode, the gate electrode is formed on the gate insulating film in a film thickness of not less than ½ of a spacing between the first fins which are adjacent to each other and less than ½ of a spacing between the second fins which are adjacent to each other.

6. The method of manufacturing a semiconductor device according to claim 5, wherein the side surface of the first fin and the side surface of the second fin are each a crystal plane with a (100) orientation.

7. The method of manufacturing a semiconductor device according to claim 5, wherein the side surface of the first fin is a crystal plane with a (100) orientation, and the side surface of the second fin is a crystal plane with a (110) orientation.

8. The method of manufacturing a semiconductor device according to claim 5, wherein a first gate electrode made of an expansive material is buried by a damascene process on the gate insulating film of the side surface of the first fin, and
    a second gate electrode made of a contractive material is buried by a damascene process on the gate insulating film of the side surface of the second fin.

9. A semiconductor device comprising:
    an insulating layer;
    a plurality of fins made of a semiconductor material on the insulating layer;
    a gate insulating film provided on side surfaces of the plurality of fins; and a gate electrode on the gate insulating film, the gate electrode applying a compressive stress to a side surface of a first fin which is used in an NMOSFET among the plurality of fins in a direction perpendicular to the side surface and applying a tensile stress to a side surface of a second fin which is used in a PMOSFET among the plurality of fins in a direction perpendicular to the side surface, wherein the gate electrode is filled in a spacing between the first fins which are adjacent to each other in a section perpendicular to the side surface of the first fins, and the gate electrode is not filled in a spacing between the second fins which are adjacent to each other in a section perpendicular to the side surface of the second fins and is formed to provide a gap.

10. The semiconductor device according to claim 9, wherein the side surface of the first fin and the side surface of the second fin are each a crystal plane with a (100) orientation.

11. The semiconductor device according to claim 9, wherein the side surface of the first fin is a crystal plane with a (100) orientation, the side surface of the second fin is a crystal plane with a (110) orientation.

12. The semiconductor device according to claim 9, wherein the gate electrode includes a first gate electrode made of an expansive material and buried on the gate insulating film of the side surface of the first fin, and includes a second gate electrode made of a contractive material and buried on the gate insulating film of the side surface of the second fin.

* * * * *